(12) United States Patent
Kaga et al.

(10) Patent No.: US 10,277,197 B2
(45) Date of Patent: Apr. 30, 2019

(54) PIEZOELECTRIC VIBRATING PIECE AND PIEZOELECTRIC DEVICE

(71) Applicant: NIHON DEMPA KOGYO CO., LTD., Tokyo (JP)

(72) Inventors: Shigetaka Kaga, Saitama (JP); Kazuhiro Hirota, Saitama (JP); Yoshiro Teshima, Saitama (JP); Masaaki Nakahara, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 336 days.

(21) Appl. No.: 15/387,654

(22) Filed: Dec. 22, 2016

(65) Prior Publication Data
US 2017/0187348 A1 Jun. 29, 2017

(30) Foreign Application Priority Data
Dec. 25, 2015 (JP) .................. 2015-253782

(51) Int. Cl.
| | |
|---|---|
| H03H 9/19 | (2006.01) |
| B06B 1/06 | (2006.01) |
| H03H 9/02 | (2006.01) |
| H03H 9/13 | (2006.01) |

(52) U.S. Cl.
CPC ............ *H03H 9/19* (2013.01); *B06B 1/0644* (2013.01); *H03H 9/02023* (2013.01); *H03H 9/13* (2013.01)

(58) Field of Classification Search
CPC ... H03H 9/19; H03H 9/02023; H03H 9/02157
See application file for complete search history.

(56) References Cited

U.S. PATENT DOCUMENTS

| | | | | |
|---|---|---|---|---|
| 4,344,010 A | * | 8/1982 | Vig ....................... | H03H 9/58 310/315 |
| 9,960,751 B2 | * | 5/2018 | Ii ........................... | H03H 9/13 |
| 2009/0252983 A1 | * | 10/2009 | Hara .................. | H03H 9/0514 428/596 |
| 2010/0231092 A1 | * | 9/2010 | Andle .................. | H03H 9/177 310/333 |

(Continued)

FOREIGN PATENT DOCUMENTS

JP   H06-085598   3/1994

*Primary Examiner* — J. San Martin
(74) *Attorney, Agent, or Firm* — JCIPRNET

(57) ABSTRACT

A piezoelectric vibrating piece includes a vibrating piece body including a vibrator and at least one pair of excitation electrodes formed on a front surface and a back surface of the vibrator. The vibrating piece body is a twice rotated quartz-crystal vibrating piece. The pair of excitation electrodes are arranged in a Z'"-axis direction determined by an X'"-axis and obliquely disposed with respect to the Y"-axis direction. The X'"-axis is rotated by 260° to 300° counterclockwise about a Y"-axis using a +X"-axis direction as a reference. The pair of excitation electrodes are formed to have respective semicircle shapes including straight line portions extending in the X'"-axis direction and to be disposed in a state where the straight line portions overlapping with one another. The straight line portion of the excitation electrode includes an inclined portion that gradually decreases in thickness toward an end portion of the excitation electrode.

20 Claims, 11 Drawing Sheets

(56) References Cited

U.S. PATENT DOCUMENTS

2013/0193807 A1* 8/2013 Mizusawa ............. H01L 41/053
                                                                310/351
2017/0302249 A1* 10/2017 Obara ...................... H03H 9/17
2018/0115301 A1* 4/2018 Kaga ..................... H01L 41/047

* cited by examiner

PIEZOELECTRIC VIBRATING PIECE AND PIEZOELECTRIC DEVICE

CROSS-REFERENCE TO RELATED APPLICATIONS

This application is based on and claims priority under 35 U.S.C. § 119 to Japanese Patent Application No. 2015-253782, filed on Dec. 25, 2015, the entire content of which is incorporated herein by reference.

TECHNICAL FIELD

This disclosure relates to a piezoelectric vibrating piece and a piezoelectric device.

DESCRIPTION OF THE RELATED ART

An electronic product such as a computer and a mobile terminal includes an electronic device such as a crystal unit, an oscillator, and a resonator. A piezoelectric device includes a piezoelectric vibrating piece that vibrates at a predetermined frequency. As the piezoelectric vibrating piece, a configuration in which a pair of electrodes is formed on a front surface and a back surface of an SC-cut crystal element, for example, is known (see Japanese Unexamined Patent Application Publication No. 6-85598). Such SC-cut crystal element is included in the piezoelectric device in a state of being held with, for example, a supporter. The SC-cut quartz crystal piece excites an unwanted response (A-mode and B-mode) as well as a main vibration (C-mode). The SC-cut quartz crystal piece requires a filter or similar part in order to suppress the B-mode that is an unwanted response near the main vibration C-mode.

In the above-described SC-cut quartz crystal piece, if the unwanted response can be suppressed only with the vibrating piece, a need for the filter or similar part can be eliminated. Thus, a circuit can be simplified to achieve an improved reliability and a reduced production cost. As a method for suppressing the B-mode, which is the unwanted response, excitation by applying an electric field in parallel with respect to the quartz crystal piece (parallel electric field excitation) is proposed. However, if the electrodes are just disposed, the parallel electric field excitation has a problem that crystal impedance (CI) becomes high compared with the quartz crystal piece shown in Japanese Unexamined Patent Application Publication No. 6-85598.

In the above-described SC-cut quartz crystal piece, an unwanted mode such as a flexure vibration may be generated superimposing on the main vibration C-mode due to a predetermined shape or position of an excitation electrode. Vibration energy of such flexure vibration is absorbed by a portion where the quartz crystal piece is held. Therefore, there is a problem that a generation of the flexure vibration increases an energy loss to cause an increase of an R1 (equivalent series resistance) and a decrease of a Q factor of the C-mode.

A need thus exists for a piezoelectric vibrating piece and a piezoelectric device which are not susceptible to the drawback mentioned above.

SUMMARY

According to an aspect of this disclosure, there is provided a piezoelectric vibrating piece. The piezoelectric vibrating piece includes a vibrating piece body and at least one pair of excitation electrodes. The vibrating piece body includes a vibrator. The at least one pair of excitation electrodes are formed on a front surface and a back surface of the vibrator. The vibrating piece body is a doubly rotated quartz-crystal vibrating piece that is cut out in parallel to an X"Z"-surface. The X"Z"-surface is rotated about a Z-axis of a crystallographic axis of a crystal and further rotated about an X'-axis. The pair of excitation electrodes are arranged in a Z'''-axis direction determined by an X'''-axis and obliquely disposed with respect to a Y"-axis direction. The X'''-axis is rotated by 260° to 300° counterclockwise about a Y"-axis using a +X"-axis direction as a reference. The pair of excitation electrodes are formed to have respective semicircle shapes including straight line portions extending in a X'''-axis direction and to be disposed in a state where the straight line portions facing or overlapping with one another when viewed from the Y"-axis direction. The straight line portion of the excitation electrode includes an inclined portion that gradually decreases in thickness toward an end portion of the excitation electrode.

BRIEF DESCRIPTION OF THE DRAWINGS

The foregoing and additional features and characteristics of this disclosure will become more apparent from the following detailed description considered with reference to the accompanying drawings, wherein:

FIG. 1A is a plan view, FIG. 1B is a cross-sectional view taken along the line A-A in FIG. 1A, FIG. 1C is a drawing illustrating a coordinate system, and FIG. 1D is a cross-sectional view of a relevant portion illustrating a modification;

FIG. 3A is a plan view illustrating a working example 1, FIG. 3B is a cross-sectional view of a relevant portion taken along the line B-B in FIG. 3A, and FIG. 3C is a cross-sectional view of a relevant portion illustrating a working example 2;

FIG. 5A is a plan view, FIG. 5B is a cross-sectional view taken along the line C-C in FIG. 5A, and FIG. 5C is a cross-sectional view illustrating a modification;

FIG. 6A is a plan view illustrating a working example 3, FIG. 6B is a back surface drawing of FIG. 6A, FIG. 6C is a plan view illustrating a working example 4, and FIG. 6D is a plan view of a relevant portion of FIG. 6C;

DETAILED DESCRIPTION

Figure 1A:
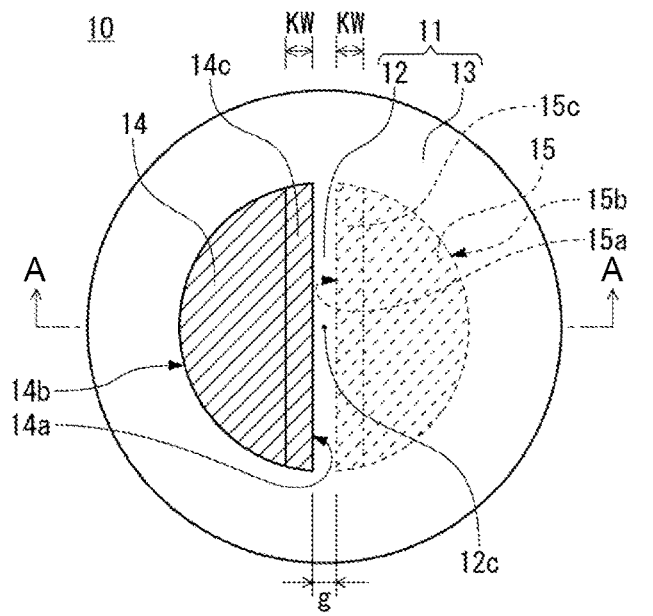
FIG. 1A to FIG. 1D illustrate an exemplary piezoelectric vibrating piece according to a first embodiment.

Hereinafter, embodiments of this disclosure will be described with reference to the drawings. It will be understood that the scope of the disclosure is not limited to the described embodiments. A scale of an expressed drawing is adjusted to explain the following embodiments. For example, a part of a drawing is enlarged or stressed as required when it is described. In the drawings, metal film areas are illustrated with a hatching pattern.

First Embodiment

Figure 1B:
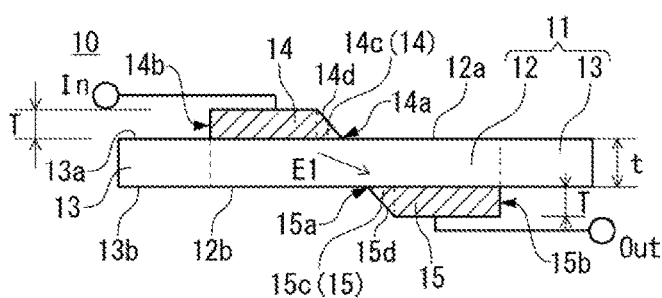
Figure 1C:
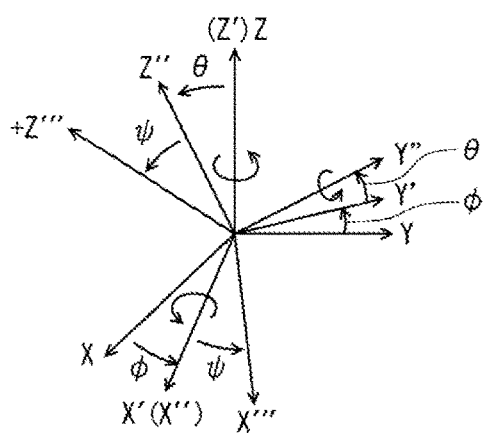
Figure 1D:
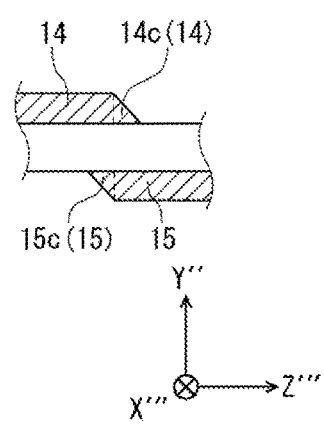

The following describes a piezoelectric vibrating piece according to a first embodiment with reference to the drawings. FIG. 1A to FIG. 1D illustrate an example of a piezoelectric vibrating piece 10 according to the first embodiment. FIG. 1A is a plan view, FIG. 1B is a cross-sectional view taken along the line A-A in FIG. 1A, FIG. 1C is a drawing illustrating a coordinate system, and FIG. 1D is a cross-sectional view of a relevant portion illustrating a modification. FIG. 1A, FIG. 1B, and FIG. 1D use an X'''Y''Z'''-coordinate system to describe directions in the drawings. This coordinate system will be described later.

As illustrated in FIG. 1A and FIG. 1B, the piezoelectric vibrating piece 10 includes a vibrating piece body 11 and a pair of excitation electrodes 14 and 15. For the vibrating piece body 11, SC-cut, which is a doubly rotated quartz-crystal vibrating piece cut out of a crystal body, is employed. For a vibrating piece body 211 or similar part of other embodiments and working examples described later, the SC-cut is also employed.

Respective axes in an XYZ-coordinate system illustrated in FIG. 1C indicate an electrical axis (X-axis), a mechanical axis (Y-axis), and an optical axis (Z-axis), which are respective crystallographic axes of the crystal. As illustrated in FIG. 1C, the vibrating piece body 11 is cut out in parallel with respect to an X''Z''-surface that is firstly rotated by an angle φ about the Z-axis and further rotated by an angle θ about an X'-axis. The angle φ is set to 22.5° and the angle θ is set to 34°. The X'''Y''Z'''-coordinate system of FIG. 1A and FIG. 1B is set by rotating by an angle ψ counterclockwise about a Y''-axis using a +X''-axis direction as a reference in an X''Y''Z''-system. An X''-axis direction, an X'''-axis direction, a Y''-axis direction, a Z''-axis direction, and a Z'''-axis direction have respective + directions in directions to which arrows in the drawing point and respective − directions in opposite directions the arrows point. Other embodiments and working examples also use the above-described coordinate system.

Such SC-cut quartz crystal piece features a temperature characteristic in a shape of a cubic curve and is used for, for example, a vibrating piece of a crystal controlled oscillator with an oven. The SC-cut quartz crystal piece generates a main vibration referred to as a C-mode and unwanted responses referred to as an A-mode and a B-mode in a high frequency region of the C-mode. The B-mode exists in a frequency region higher than the C-mode by approximately 10%. Therefore, there is a possibility of the B-mode generation when a desired frequency is expected to be obtained by the C-mode. Crystal impedance (CI) of the A-mode is large compared with CI of the C-mode, and a frequency of the A-mode is approximately 1.88 times of the C-mode, which is sufficiently separated. Therefore, the A-mode is less likely to be a problem in the embodiments.

The vibrating piece body 11 is formed in a flat plate and disk shape. The vibrating piece body 11 is formed such that the X'''Z'''-axis direction is a planar direction. The vibrating piece body 11 has a thickness direction in the Y''-axis direction. This vibrating piece body 11 includes a vibrator 12 and a peripheral portion 13.

The vibrator 12 is a portion that generates a vibration of a predetermined frequency. The vibrator 12 is formed in a disk shape including a center portion of the vibrating piece body 11 when viewed from the Y''-axis direction. This vibrator 12 has a thickness t in the Y''-axis direction. The peripheral portion 13 is formed to surround the vibrator 12 when viewed from the Y''-axis direction. The peripheral portion 13 is a portion that is held with supporters 141 and 142 when the piezoelectric vibrating piece is housed, for example, in a package (see FIG. 11). A front surface (a surface on a +Y''-side) 12a of the vibrator 12 and a front surface (the surface on the +Y''-side) 13a of the peripheral portion 13 are on an identical surface. A back surface (a surface on a −Y''-side) 12b of the vibrator 12 and a back surface (the surface on the −Y''-side) 13b of the peripheral portion 13 are on an identical surface.

The vibrating piece body 11 is not limited to the above-described shape. For example, the vibrating piece body 11 may have a convex shape on one surface or both surfaces, may be formed with a mesa on one surface or both surfaces, or may be bevel processed. These variations of the vibrating piece body 11 are similarly applied to the vibrating piece body 211 according to an embodiment described later.

The excitation electrode 14 and the excitation electrode 15 form a pair of electrodes together. This pair of excitation electrodes 14 and 15 are arranged in the Z'''-axis direction that is determined by the X'''-axis direction rotated by the angle ψ counterclockwise about the Y''-axis using the +X''-axis direction as a reference. The angle ψ is set to 260° to 300°. As illustrated in FIG. 1B, the excitation electrodes 14 and 15 are arranged in a direction inclining with respect to the Y''-axis direction. Such excitation electrodes 14 and 15 cause the vibrator 12 to vibrate at the predetermined frequency when an electric field E1 is applied in the inclining direction with respect to the Y''-axis direction in the vibrator 12. The direction of the electric field E1 illustrated in FIG. 1B is a case where the excitation electrode 14 on a −Z'''-side is an input side In and the excitation electrode 15 on a +Z'''-side is an output side Out.

The excitation electrode 14 is formed on the front surface 12a of the vibrator 12. On the other hand, the excitation electrode 15 is formed on the back surface 12b of the vibrator 12. The excitation electrode 14 and the excitation electrode 15 have a thickness (a length in the Y''-axis direction) T. While the respective thicknesses T of the excitation electrode 14 and the excitation electrode 15 are set to be identical, different thicknesses may also be set. The pair of excitation electrodes 14 and 15 are formed to have respective semicircle shapes, and include straight line portions 14a and 15a extending in the X'''-axis direction and arc portions 14b and 15b connecting both end portions of the straight line portions 14a and 15a. The pair of excitation electrodes 14 and 15 are each disposed with an interval g in the Z'''-axis direction in a state where the straight line portions 14a and 15a face to one another when viewed from the Y''-axis direction.

In the piezoelectric vibrating piece 10, a value calculated by dividing the interval g by the thickness t of the vibrator (a value of g/t) is set to fall within 0.183 to 0.366. The interval g is set such that the value of g/t falls within the above-described predetermined value. For example, in the case where the value of g/t is set to 0.183 for the piezoelectric vibrating piece 10 and one with 546 µm of the thickness t is employed for the vibrating piece body 11, the interval g is formed to 100 µm. In the case where the value of g/t is set to 0.366 for the piezoelectric vibrating piece 10 and one with 546 µm of the thickness t is employed for the vibrating piece body 11, the interval g is formed to 200 µm. Such value of g/t can be set as necessary corresponding to vibration strength of a desired C-mode and may be set to a value less than 0.183 or exceeding 0.366.

The configuration of the excitation electrodes 14 and 15 and the value of g/t described above are similarly applied to and set for other embodiments and working examples described later. However, the pair of the excitation electrodes 14 and 15 are both not limited to be arranged with the interval g in a state where the straight line portions 14a and 15a face to one another when viewed from the Y"-axis direction. The pair of excitation electrodes 14 and 15 may be disposed without the interval g (in a state where g=0). The pair of the excitation electrodes 14 and 15 may each be disposed in a state where the straight line portions 14a and 15a are overlapped to one another when viewed from the Y"-axis direction. That is, as illustrated in FIG. 1D, the excitation electrode 14 and the excitation electrode 15 may be disposed in a state where parts of regions of one another are overlapped when viewed from the Y"-axis direction. A variation regarding the arrangement of the pair of excitation electrodes 14 and 15 described above are similarly applied to other embodiments, which will be described later.

The straight line portions 14a and 15a of the pair of excitation electrodes 14 and 15 include inclined portions 14c and 15c, respectively. The inclined portion 14c and the inclined portion 15c have respective predetermined incline widths (width) KW in the Z'"-axis direction. The width KW of the inclined portion 14c of the excitation electrode 14 on the −Z'"-side and the inclined width KW of the inclined portion 15c of the excitation electrode 15 on the +Z'"-side are set to be identical. The inclined portion 14c and the inclined portion 15c may have different widths KW from one another. Any one of the inclined portions 14c (15c) of the inclined portions 14c and the inclined portion 15c may not be disposed.

The inclined portions 14c and 15c are formed to the whole length in the X'"-axis direction of the straight line portions 14a and 15a so as to extend in the X'"-axis direction. The inclined portions 14c and 15c are configured such that the thicknesses (the length in the Y"-axis direction) T of the excitation electrodes 14 and 15 gradually reduce toward end portions. That is, the excitation electrode 14 has the thickness T gradually reducing toward the end portion on the +Z'"-side in the inclined portion 14c (the length in the Y"-axis direction gradually getting short) and the excitation electrode 15 has the thickness T gradually reducing toward the end portion on the −Z'"-side in the inclined portion 15c. While the respective thicknesses T of the excitation electrode 14 and the excitation electrode 15 are set to be identical, the thicknesses T may be different from one another. A surface of the excitation electrode 14 or similar part on which the inclined portion 14c cannot be disposed is, for example, formed to be a flat surface in the X'"Z'"-direction.

Both a surface of the inclined portion 14c (the surface on the +Y"-side) and a surface of the inclined portion 15c (the surface on the −Y"-side) are planar-shaped inclined surfaces 14d and 15d inclining with respect to an X'"Z'"-direction and an X'"Y'"-direction. That is, as illustrated in FIG. 1B, the excitation electrodes 14 and 15 have shapes that cut off corner portions of the straight line portions 14a and 15a (an end portion on the +Y"-side and on the +Z'"-side for the excitation electrode 14 and an end portion on the −Y"-side and on the −Z'"-side for the excitation electrode 15) in a straight line on a cross-sectional surface in a Y"Z'"-direction.

The inclined portion 14c or similar portion is not limited to include the planar shaped inclined surface 14d or similar surface. The inclined portion 14c or similar portion may have any shape as long as the inclined portion 14c or similar portion gradually reduces the thickness toward the end portion of the excitation electrode 14 or similar part. The surface of the inclined portion 14c or similar portion may be, for example, an inclined surface in a curved shape or may be a staircase pattern such as an inclined portion 214c or similar portion in a working example 1 and a working example 2 (see FIG. 3B and FIG. 3C), which will be described later. The inclined portion 14c or similar portion may be disposed in any one straight line portion 14a (15a) of the two straight line portions 14a and 15a of the pair of excitation electrodes 14 and 15 and may not be disposed in the other straight line portion 15a (14a). The inclined portion 14c or similar portion may be disposed in a part of the straight line portion 14a or similar portion. In the case where the inclined portion 14c or similar portion is formed in a staircase pattern, the number of the steps formed in the inclined portion 14c or similar portion can arbitrarily be set. In this case, the number of the steps of the inclined portion 14c and the inclined portion 15c may be identical or different with one another.

The pair of excitation electrodes 14 and 15 are each disposed parallel to the X'"-axis direction and linearly symmetrical with respect to a straight line passing through a center of a thickness of a center 12c of the vibrating piece body 11 when viewed from the Y"-axis direction. The pair of excitation electrodes 14 and 15 are not limited to a symmetrical configuration as described above.

As the excitation electrodes 14 and 15, a conductive metal film is used. As the metal film, for example, one layer or a plurality of layers of a single metal with excellent conductivity such as gold (Au) or silver (Ag) may be employed, or a laminated structure of two layers or three layers that forms a film of chrome (Cr), titanium (Ti), or nickel (Ni), or nickel chrome (NiCr), nickel titanium (NiTi), or nickel tungsten (NiW) alloy as a base layer having a role to improve an adhesion of each of the electrodes relative to a quartz-crystal material and forms a film of gold or silver thereon may be employed. An excitation electrode 24 or similar part according to a second embodiment described later employs the metal film of the configuration described above.

On the front surface 13a and the back surface 13b of the peripheral portion 13 may be formed with extraction electrodes extracted to the end portion of the vibrating piece body 11 from the end portion of the excitation electrodes 14 and 15, respectively. The extraction electrodes are electrically connected to the respective excitation electrodes 14 and 15. Such extraction electrodes are formed, in the case where the piezoelectric vibrating piece 10 is included in another component such as a package, to electrically connect the excitation electrodes 14 and 15 to this component. As this extraction electrode, an extraction electrode 216 or similar part (see FIG. 3A to FIG. 3C) according to the working example 1 described later may be employed. The above-described matters regarding the extraction electrode is similarly applied to the second embodiment described later.

As described above, the angle ψ of the piezoelectric vibrating piece 10 of this embodiment is set to 260° to 300°. In the case where the angle ψ is set to 260° to 280°, a C1 (equivalent series capacitance) of the C-mode becomes the maximum value of the case when the angle ψ is varied to 0° to 360° or a value close to this to strongly excite the C-mode, and the C1 of the B-mode becomes the minimum value of the case when the angle ψ is varied to 0° to 360° or a value close to this to suppress the excitation of the B-mode. In the case where the angle ψ is set to 280° to 300°, the C1 of the C-mode becomes a sufficiently high value compared with the C1 of the B-mode and the CI of the B-mode becomes a value of approximately ten times or more of the CI of the C-mode. Therefore, an excitation efficiency of the C-mode improves compared with an excitation efficiency of the B-mode and the vibration-excitation of the B-mode is strongly suppressed compared with the vibration-excitation of the C-mode. Accordingly, setting the angle ψ to 260° to 300° in the piezoelectric vibrating piece 10 ensures the improved excitation efficiency of the main vibration, C-mode, the decreased CI, and the suppressed unwanted response, B-mode, compared with the parallel electric field excitation.

Furthermore, the value of g/t of the piezoelectric vibrating piece 10 is set to 0.183 to 0.366, thus the C1 of the B-mode becomes approximately '0' with the angle ψ being 260° to 280°. Accordingly, the above-described piezoelectric vibrating piece 10 can suppress the B-mode almost completely.

When the electric field E1 is applied to the vibrator 12 of the piezoelectric vibrating piece 10 of the above-described configuration, an unnecessary vibration (the flexure vibration) that is a different flexure mode from any one of the A-mode, the B-mode, and the C-mode is generated in the piezoelectric vibrating piece 10. This flexure vibration is generated by the vibration energy being transformed to the flexure mode in the vibrator 12 near the end portion of the excitation electrodes 14 and 15 on sides of the straight line portions 14a and 15a. This vibration energy caused by the flexure vibration is absorbed, for example, by conductive adhesives 220 and 220 disposed at held portions of the piezoelectric vibrating piece 10 and the supporters 141 and 142 (see FIG. 11), which hold the piezoelectric vibrating piece 10. Therefore, the energy of the flexure vibration directly becomes a loss of energy and causes an increase of an R1 and a decrease of a Q factor of the C-mode. Accordingly, a generation of the flexure vibration in the piezoelectric vibrating piece 10 lowers the excitation efficiency of the C-mode.

However, since the piezoelectric vibrating piece 10 of the configuration described above includes the inclined portion 14c or similar portion in the straight line portion 14a or similar portion, the transformation of the vibration energy to the flexure mode is suppressed in the vibrator 12 near the end portion of the excitation electrode 14 or similar part on the straight line portions 14a and 15a sides, thereby suppressing the flexure vibration. Therefore, in the piezoelectric vibrating piece 10, the increase of the R1 and the decrease of the Q factor caused by the flexure vibration are suppressed, thereby suppressing lowering of the excitation efficiency of the C-mode.

Thus, according to the piezoelectric vibrating piece 10 configured as described above, suppressing the B-mode, which is the unwanted response, only with the piezoelectric vibrating piece 10 eliminates the need for the filter or similar part to suppress the B-mode. Thus, simplifying a circuit ensures improving reliability and reducing the production cost. Furthermore, according to the piezoelectric vibrating piece 10, the configuration of the inclined portion 14c or similar portion suppresses the generation of the flexure vibration, thereby ensuring suppressing both the increase of the R1 and the decrease of the Q factor of the C-mode of the piezoelectric vibrating piece 10 to provide a piezoelectric vibrating piece of a good quality.

Figure 2:
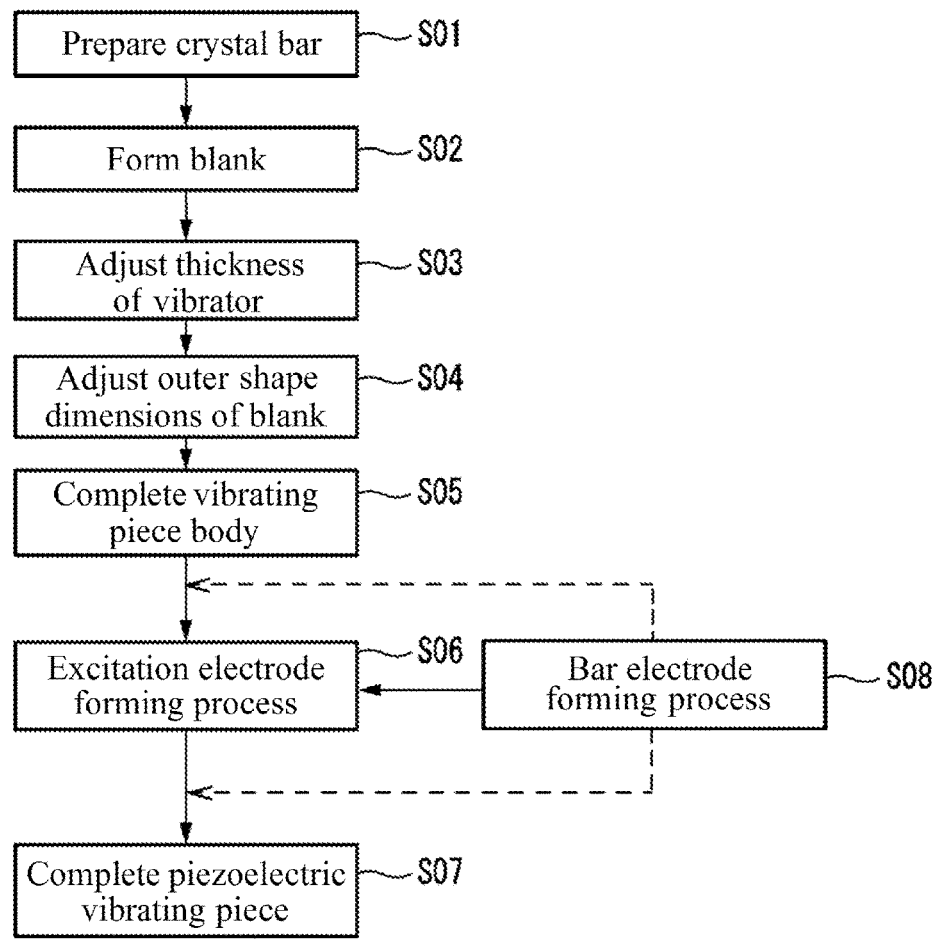
FIG. 2 is a flowchart illustrating a method for fabricating the piezoelectric vibrating piece according to the embodiment.

Next, an exemplary method for fabricating the piezoelectric vibrating piece 10 will be described with reference to the drawing. FIG. 2 is a flowchart illustrating an exemplary method for fabricating the piezoelectric vibrating piece 10 of the present disclosure. This fabricating method will be described along with the flowchart illustrated in FIG. 2. This fabricating method includes process of Step S01 to Step S06 illustrated in FIG. 2.

As illustrated in FIG. 2, first, a crystal bar of a synthetic quartz crystal is prepared (Step S01). Next, a blank is formed by cutting out the blank at a predetermined thickness using the SC-cut from the crystal bar of the prepared synthetic quartz crystal (Step S02). Subsequently, the thickness t of the vibrator 12 is adjusted by lapping process or similar process such that the blank vibrates at the predetermined frequency (Step S03). Subsequently, the blank is formed to have a predetermined outer shape and dimensions (Step S04). This forms the blank into a predetermined disk-shape and forms portions equivalent to the vibrator 12 and the peripheral portion 13. Subsequently, a processing strain generated on a surface of the blank is removed by etching or similar method and the surface of the blank is cleaned to form the vibrating piece body 11 (Step S05).

Subsequently, on the front surface 12a and the back surface 12b of the vibrator 12 of the vibrating piece body 11, the excitation electrodes 14 and 15 are formed (excitation electrode forming process) (Step S06). The excitation electrodes 14 and 15 are formed by forming a metal film in a predetermined region of the front surface 12a and the back surface 12b. This forming of metal film employs a method, for example, a photolithography method and etching, sputtering or a vacuum evaporation via a metal mask, a printing method such as screen-printing, or plating. The inclined portion 14c or similar portion is formed by removing the corner portion of the straight line portion of the metal film in an inclined surface shape, for example, by trimming using an ion beam or laser or the photolithography method and etching after the metal film is formed in a semicircle and planar shape. The inclined portion 14c or similar portion may be formed by varying a clearance or a film formation angle when the metal film is formed by the above-described sputtering or vacuum evaporation. In the case where the extraction electrode is formed in the vibrating piece body 11, the extraction electrode is formed by forming a metal film in a formation region of the extraction electrode on the front surface 13a and the back surface 13b of the peripheral portion 13 of the vibrating piece body 11. The metal film constituting this extraction electrode is simultaneously formed by an identical method to form the metal film constituting, for example, the excitation electrodes 14 and 15. This completes the piezoelectric vibrating piece 10.

Such piezoelectric vibrating piece 10 has a relatively moderate transition of a vibration characteristic from a design value in the case where the angle ψ or the interval g differs from a design value, thereby allowing a dimensional tolerance of the excitation electrodes 14 and 15 to keep a sufficient margin. Therefore, fabricating the piezoelectric vibrating piece 10 that is configured to be the predetermined dimensions is relatively easy. A method for fabricating a piezoelectric vibrating piece 210 or similar part according to other embodiments and working examples described later is approximately similar to the above-described fabricating method.

Working Examples 1 and 2

Figure 3A:
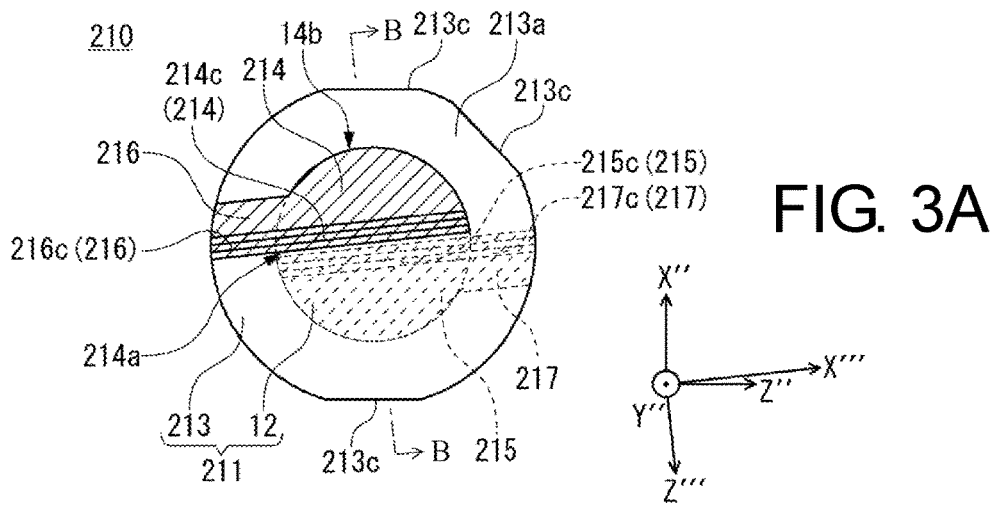
FIG. 3A to FIG. 3C illustrate working examples according to the first embodiment.
Figure 3B:
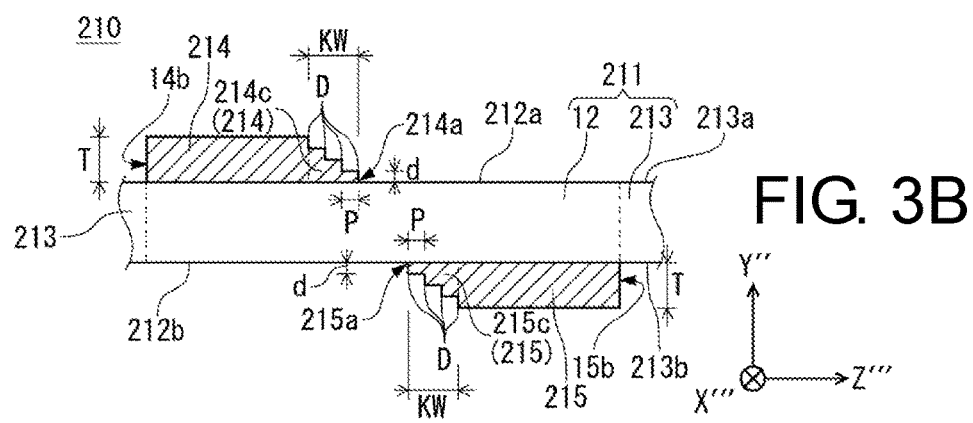
Figure 3C:
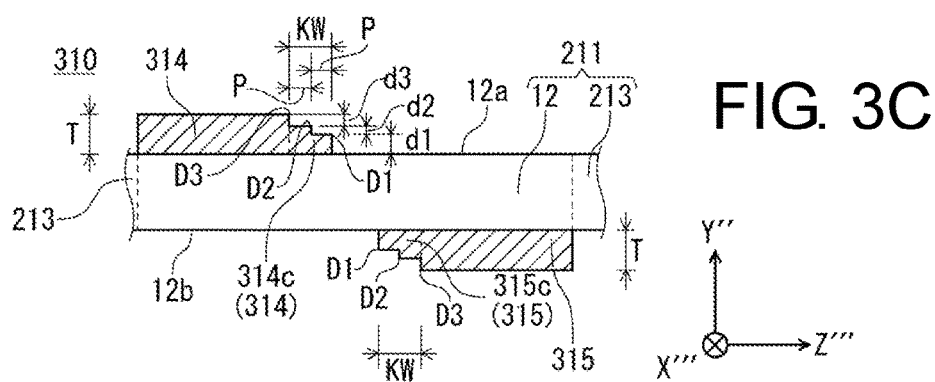

Next, the following describes the working example 1 and the working example 2 with reference to the drawings. Both the working example 1 and the working example 2 are working examples relating to the above-described first embodiment and including the inclined portions 14c and 15c. In the following description, a component that is identical or equal to that of the first embodiment is indicated by the same reference numeral, and the description thereof is omitted or simplified. FIG. 3A to FIG. 3C illustrate the working examples relating to the first embodiment. FIG. 3A is a plan view illustrating the working example 1, FIG. 3B is a cross-sectional view of a relevant portion taken along the line B-B in FIG. 3A, and FIG. 3C is a cross-sectional view of a relevant portion illustrating the working example 2. FIG. 3C is a drawing equivalent to a cross-sectional view taken along the line B-B in FIG. 3A.

As illustrated in FIG. 3A and FIG. 3B, the piezoelectric vibrating piece 210 according to the working example 1 includes the vibrating piece body 211 and excitation electrodes 214 and 215. The vibrating piece body 211 is the SC-cut and formed in a disk shape when viewed from the Y'''-axis direction. Although the illustration is omitted, the vibrating piece body 211 is formed in a convex shape on one surface. A front surface of the vibrating piece body 211 (a principal surface on the +Y''-side) is formed to have a planar shape and a back surface (a principal surface on the −Y''-side) is formed to have a gently curved shape. The vibrating piece body 211 may have the front surface formed in the curved shape and the back surface formed in the planar shape. The vibrating piece body 211 having such convex shape efficiently locks in the vibration energy, thereby allowing the CI to decrease.

Cutouts 213c that are cut out in straight lines are formed on the +X''-side, the −X''-side, and a +X''' and −Z'''-side of the vibrating piece body 211. These cutouts 213c may be formed, for example, as a reference of a crystal orientation or as a positional reference for forming the excitation electrodes 214 and 215 and installing to the supporters 141 and 142 (see FIG. 11).

The excitation electrodes 214 and 215 are configured similarly to the above-described excitation electrodes 14 and 15 except for the configuration of the inclined portions 214c and 215c. The angle ψ is set to 280°. The interval g is set such that the value of g/t becomes 0.183. The excitation electrodes 214 and 215 are the metal films made of gold (Au). The thickness T of the excitation electrodes 214 and 215 is set to 700 Å. The angle ψ, the interval g, and the metal film configuration in the excitation electrodes 214 and 215 described above are identically set for an excitation electrode 314 or similar part of the working example 2 and a working example 3 to a working example 16, which will be described later.

The excitation electrodes 214 and 215 include the inclined portions 214c and 215c in straight line portions 214a and 215a. The inclined portion 214c or similar portion is formed such that the thickness T of the excitation electrode 214 or similar part gradually reduces toward an end portion of the excitation electrode 214 or similar part in a staircase pattern. The front surface of the inclined portion 214c (+Y''-side surface) and the front surface of the inclined portion 215c (−Y''-side surface) are both in a staircase pattern, and include respective four stepped portions D. Heights (the length in the Y''-axis direction) d of each of the stepped portions D are set to 175 Å. Lengths (inclination pitch) P in the Z'''-axis direction of each of the stepped portions D are set to an identical length. Such excitation electrodes 214 and 215 are configured such that the four semicircle-shaped metal films whose thickness (the length in the Y''-axis direction) is set to 175 Å are laminated in the Y''-axis direction. The staircase-patterned inclined portions 214c and 215c are formed by these four metal films being formed in order with overlapping the arc portions in the Y''-axis direction and shifting the straight line portions by the inclination pitch P in the Z'''-axis direction. The inclined portion 214c or similar portion may be one layer of the metal film whose thickness is set to 700 Å. In this case, the inclined portion 214c or similar portion is formed by the straight line portion 14a or similar portion of the metal film after the film formation being removed in a staircase pattern.

The piezoelectric vibrating piece 210 includes the extraction electrodes 216 and 217. The extraction electrode 216 is disposed on a front surface (the +Y''-side surface) 213a of a peripheral portion 213. The extraction electrode 216 is extracted in the −X'''-direction from the excitation electrode 214 and formed to the end portion of the vibrating piece body 211 on the −X'''-side. The extraction electrode 217 is disposed on a back surface (the −Y''-side surface) 213b of the peripheral portion 213. The extraction electrode 217 is extracted in the +X'''-direction from the excitation electrode 215 and formed to the end portion of the vibrating piece body 211 on the +X'''-side. In the extraction electrodes 216 and 217, inclined portions 216c and 217c are disposed that is configured similarly to the inclined portion 214c or similar portion of the excitation electrode 214 or similar part. The extraction electrode 216 or similar part, for example, is configured integrally with the excitation electrode 214 or similar part and constituted of a similar metal film to the excitation electrode 214 or similar part.

An oscillation frequency of the piezoelectric vibrating piece 210 according to the working example 1 is set to 10 MHz with the 3rd overtone vibration. A wavelength λ of the flexure vibration generated in this piezoelectric vibrating piece 210 is 324 μm. The same applies to a piezoelectric vibrating piece 310 according to the working example 2. Furthermore, the same applies to the piezoelectric vibrating piece 210 or similar part according to a comparative example 1 and a comparative example 2 and the working example 3 to the working example 16, which will be described later.

Figure 4:
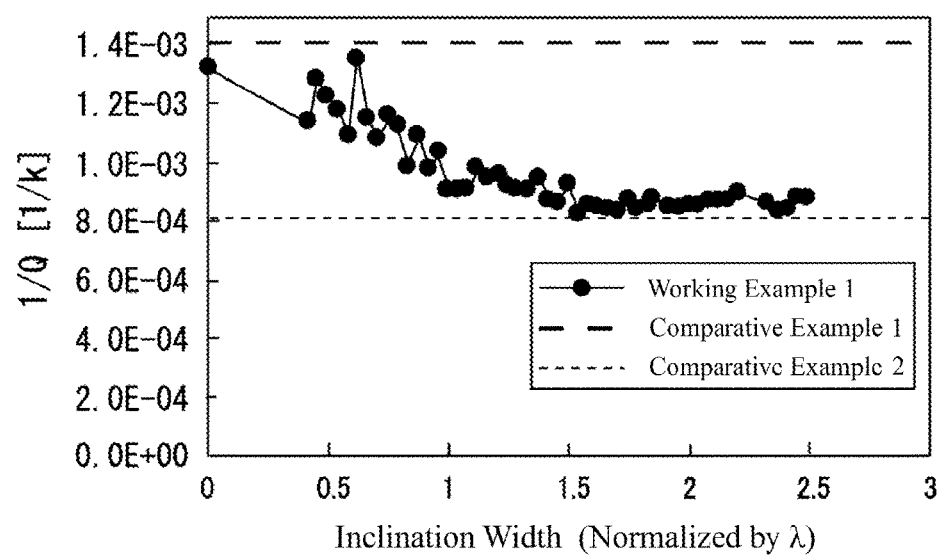
FIG. 4 is a graph illustrating an energy loss when an inclination width is varied in the working example 1.

FIG. 4 is a graph illustrating a vibration energy loss of the C-mode in the case where the width KW of the inclined portions 214c and 215c is varied in the working example 1. The graph in FIG. 4 is based on numerical analysis (finite element method). In FIG. 4, a vertical axis indicates the loss of the vibration energy of the C-mode and the numerical values on the vertical axis are values that are one-thousandth of reciprocals of the Q factors of the C-mode. A horizontal axis indicates the width KW. However, the width KW on the horizontal axis is indicated being normalized and the numerical values of the horizontal axis are value that are calculated by the width KW being divided by the wavelength λ (324 μm) of the flexure vibration in the working example 1. In FIG. 4, values of the vibration energy losses in the comparative example 1 and the comparative example 2 are respectively illustrated as well as the graph of the working example 1. The comparative example 1 has an almost similar configuration to the working example 1 but is different from the working example 1 in that the inclined portion 214c or similar portion is not formed in the excitation electrode. The comparative example 2 has an almost similar configuration to the comparative example 1 but is different from the comparative example 1 in that the excitation electrode is formed to have a perfect circular shape. The excitation electrode in the comparative example 2 is formed in a perfect circular region including a formation region of the semicircle of the excitation electrode in the comparative example 1 on a front surface 212a and a back surface 212b of a vibrator 212, respectively. In such configuration of the comparative example 2, the end portion of the excitation electrode is not formed in a central portion of the vibrator 212 where an electric potential transition is large compared with the peripheral portion 213. Accordingly, in the comparative example 2, the generation of the flexure vibration is considered to be extremely small compared with the comparative example 1 and each of the working examples. The thicknesses of the excitation electrodes in the comparative example 1 and the comparative example 2 are identical to the thickness T of the excitation electrode 214 or similar part in the working example 1 and set to 700 Å, respectively. In FIG. 4, the values that the graphs of the comparative example 1 and the comparative example 2 indicate are actually measured values.

As illustrated in FIG. 4, it is confirmed that the wider the width KW of the inclined portions 214c and 215c is formed, the smaller the vibration energy loss of the C-mode is. In the case where the values calculated by dividing the width KW by the wavelength λ (the values on the horizontal axis in FIG. 4) are set to 1.5 or more (1.5λ or more), the vibration energy loss of the C-mode is confirmed to decrease approaching the numerical values of the comparative example 2. Accordingly, setting the inclination width KW to 1.5λ or more in the working example 1 ensures suppressing the generation of the flexure vibration and suppressing lowering of output efficiency of the main vibration C-mode.

In the graphs in FIG. 4 showing the relationship between the width KW of the inclined portion 214c or similar portion and the vibration energy loss of the C-mode, the values normalized with the wavelength λ of the flexure vibration as a reference is used as the values regarding the width KW, values normalized with a wavelength of the C-mode as a reference instead of the wavelength λ of the flexure vibration may be used. Even in this case, the effect of reducing the energy loss is indicated when the width of the inclined portion 214c or similar portion is set to have a length that is double the predetermined length with respect to the wavelength of the C-mode, similar to the result the graph in FIG. 4 indicates.

As illustrated in FIG. 3C, the piezoelectric vibrating piece 310 according to the working example 2 has a similar configuration to the working example 1 except for an inclined portion 314c or similar portion. The inclined portions 314c and 315c in the working example 2 are formed in a staircase pattern such that the thickness T gradually reduces toward the end portion of the excitation electrode 314 or similar part, similar to the inclined portion 214c or similar portion in the working example 1. However, the inclined portions 314c and 315c in the working example 2 are configured to be three stairs, including respective three stepped portions D1 to D3. Each of heights (the length in the Y"-axis direction) d1, d2, and d3 of the stepped portions D1 to D3 is set to 300 Å for the height d1, 200 Å for the height d2, and 200 Å for the height d3, respectively, in an order from sides of the front surface 12a or the back surface 12b of the vibrator 12. The inclination width KW is set to 540 μm. This inclination width KW is equivalent to a length that is approximately 1.67 times of the wavelength λ of the flexure vibration (1.67λ). The inclination pitch P of the respective stepped portion D of the inclined portion 314c or similar portion is set to 270 μm. The fabricating method of the working example 2 is similar to the fabricating method of the working example 1.

Subsequently, experiments to measure the Q factor and the CI of the C-mode for the working example 2 and the comparative example 1 were performed. Table 1 shows the results of the above-described experiments. As illustrated in Table 1, comparing the Q factors of the C-modes, the comparative example 1 indicates 724, 000 and the working example 2 indicates 954, 000. This confirms that the Q factor is large according to the working example 2, which has a configuration with the inclined portion 314c or similar portion, compared with the comparative example 1, which has a configuration without the inclined portion. From this result, it is considered that in a configuration where the inclined portion 314c or similar portion is disposed in the piezoelectric vibrating piece 310, the generation of the flexure vibration is suppressed and the absorption of the vibration energy at the held portion of the piezoelectric vibrating piece 310 is reduced, thereby the Q factor becomes large compared with the configuration without the inclined portion 314c or similar portion.

Comparing the CI of the C-modes, the comparative example 1 indicates 355Ω and the working example 2 indicates 273Ω, as illustrated in Table 1. This confirms that the CI is smaller than the comparative example 1 according to the working example 2, which has a configuration with the inclined portion 314c.

TABLE 1

|  | CI [Ω] | Q [k] |
|---|---|---|
| Comparative Example 1 | 355 | 724 |
| Working Example 2 | 273 | 954 |

Second Embodiment

Figure 5A:
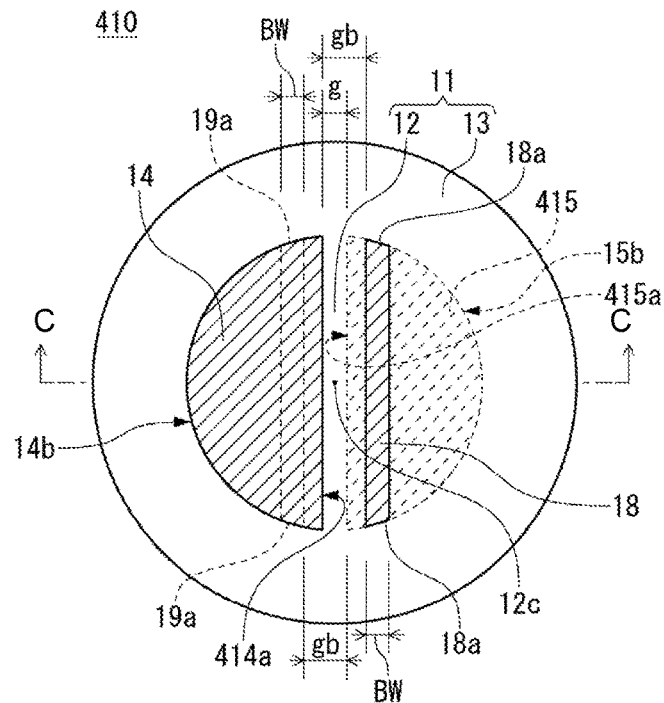
FIG. 5A to FIG. 5C illustrate an exemplary piezoelectric vibrating piece according to a second embodiment.
Figure 5B:
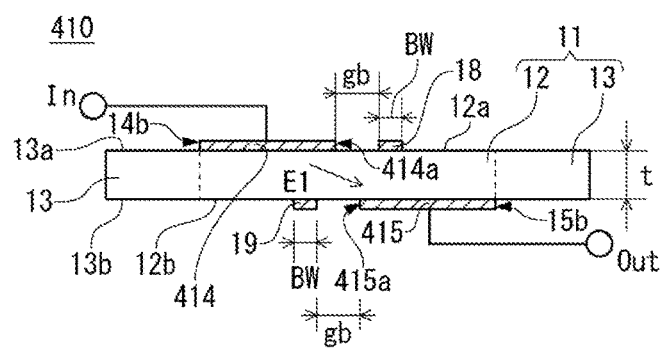
Figure 5C:
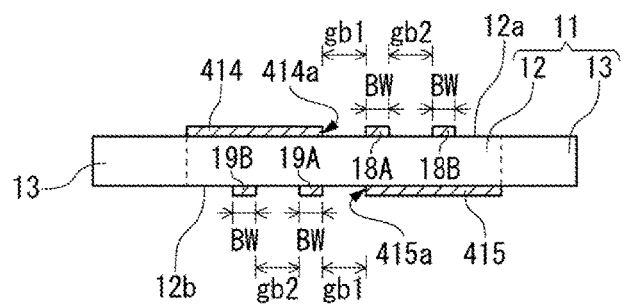

The following describes the second embodiment with reference to the drawings. In the following description, a component that is identical or equal to that of the first embodiment is indicated by the same reference numeral, and the description thereof is omitted or simplified. FIG. 5A to FIG. 5C illustrate an example of a piezoelectric vibrating piece 410 according to the second embodiment. FIG. 5A is a plan view, FIG. 5B is a cross-sectional view taken along the line C-C in FIG. 5A, and FIG. 5C is a cross-sectional view illustrating a modification. FIG. 5C is a drawing equivalent to a cross-sectional view taken along the line C-C in FIG. 5A. As illustrated in FIG. 5A to FIG. 5C, the piezoelectric vibrating piece 410 includes the vibrating piece body 11, a pair of excitation electrodes 414 and 415, and bar electrodes 18 and 19.

The pair of excitation electrodes 414 and 415 have similar configurations to the pair of excitation electrodes 14 and 15 of the first embodiment described above except that the inclined portion 14c or similar portion is not formed.

The bar electrodes 18 and 19 are formed on the front surface 12a and the back surface 12b of the vibrator 12, respectively. The bar electrodes 18 and 19 are arranged so as to separate from straight line portions 414a and 415a on sides of the straight line portions 414a and 415a of the excitation electrodes 414 and 415. The bar electrodes 18 and 19 are formed with an interval gb with the excitation electrodes 414 and 415 in the Z'''-axis direction. The bar electrodes 18 and 19 are the electrodes that are not electrically connected to any others. The bar electrodes 18 and 19 are, what is called, dummy electrodes. The bar electrodes 18 and 19 have predetermined width BW in the Z'''-axis direction. The bar electrodes 18 and 19 are formed to extend in the X'''-axis direction. This width BW can arbitrarily be set within a range the bar electrodes 18 and 19 can be formed on the front surface 12a and the back surface 12b of the vibrator 12. The bar electrodes 18 and 19 are formed to have a length that includes a region of the vibrator 12 in the X'''-axis direction. As illustrated in FIG. 5A, both end portions 18a and 19a of the bar electrodes 18 and 19 in the X'''-axis direction are arc-shaped and formed along the end portion of the vibrator 12 of a disk-shape when viewed from the Y"-axis direction (on a circular arc of a circle passing through the arc portions 14b and 15b of the excitation electrodes 414 and 415 when viewed from the Y"-axis direction). The end portion 18a or similar part of the bar electrode 18 or similar part may be formed in the central portion of the vibrator 12 or in the peripheral portion 13 when viewed from the Y"-axis direction.

The bar electrodes 18 and 19 are disposed one on the front surface 12a and one on the back surface 12b of the vibrator 12, respectively, in the piezoelectric vibrating piece 410. These bar electrodes 18 and 19 are both parallel to the X'''-axis direction and disposed linearly symmetrical with respect to the straight line passing through the center of the thickness of the center 12c of the vibrating piece body 11 viewed from the Y"-axis direction. The bar electrodes 18 and 19 are formed with a material and a thickness (the length in the Y"-axis direction) identical to the excitation electrodes 414 and 415. The bar electrodes 18 and 19 are formed, for example, by the film formation method of the metal film similar to the above-described excitation electrodes 414 and 415.

The bar electrode 18 or similar part is not limited to the linearly symmetrical configuration described above. One or both the material and the thickness of the bar electrode 18 or similar part may be different from the material and the thickness of the excitation electrode 414 or similar part. The bar electrode 18 or similar part is not limited to the configuration having the length including the region of the vibrator 12 in the X'''-axis direction. The bar electrode 18 or similar part may be formed, for example, only in a part of the region of the vibrator 12 in the X'''-axis direction. In the case where the excitation electrode 414 or similar part are configured such that a plurality of metal films are laminated, the bar electrode 18 or similar part may be configured with a material and a thickness identical to a part of the metal films of the plurality of metal films constituting the excitation electrode 414 or similar part.

The bar electrode 18 or similar part is not limited to be disposed one each on the front surface 12a and the back surface 12b of the vibrator 12. The bar electrode 18 or similar part can be disposed two each on the front surface 12a and the back surface 12b. For example, as illustrated in FIG. 5C, on each of the front surface 12a and the back surface 12b, the following configuration is also possible: first bar electrodes 18A and 19A are arranged with a first interval gb1 in the Z'''-axis direction from the straight line portions 414a and 415a of the excitation electrodes 414 and 415 and second bar electrodes 18B and 19B arranged with a second interval gb2 from the first bar electrodes 18A and 19A. The bar electrode 18 or similar part can also be disposed three or more each on the front surface 12a and the back surface 12b of the vibrator 12. The number of the bar electrode 18 or similar part may be identical or different on the front surface 12a and the back surface 12b of the vibrator 12. A plurality of bar electrodes 18 or similar parts may be disposed on only one surface of the front surface 12a and the back surface 12b of the vibrator 12. In the case where the plurality of bar electrodes 18 or similar parts are disposed on one or both surfaces of the front surface 12a and the back surface 12b of the vibrator 12, the plurality of bar electrodes 18 or similar parts may be disposed in parallel to one another or may be disposed so as to extend in a direction intersecting with one another. Each of the widths BW of the plurality of bar electrodes 18 or similar parts in the Z'''-axis direction may be set to be identical, or may be different as a whole or in a part of the plurality of bar electrodes 18 or similar parts.

According to the piezoelectric vibrating piece 410, the angle ψ is set 260° to 300° like the first embodiment. This ensures the improved excitation efficiency of C-mode of the main vibration and the decreased CI compared with a parallel electric field excitation. This suppresses unwanted response, B-mode. The value of g/t of the piezoelectric vibrating piece 410 is set to 0.183 to 0.366, thus the C1 of the B-mode becomes approximately '0' with the angle ψ being 260° to 280°. Accordingly, the piezoelectric vibrating piece 410 configured such that the value of g/t is set as described above can suppress the B-mode almost completely.

When the predetermined electric field E1 is applied to the piezoelectric vibrating piece 410, an unnecessary flexure vibration that is different from any of the B-mode and the C-mode is generated in the piezoelectric vibrating piece 410. Such flexure vibration becomes a cause of the increase of the R1 and the decrease of the Q factor of the C-mode of the piezoelectric vibrating piece 410 to lower the excitation efficiency of the C-mode. However, according to the above-described piezoelectric vibrating piece 410, disposing the bar electrode 18 or similar part ensures suppressing the flexure vibration.

Thus, according to the piezoelectric vibrating piece 410, suppressing the B-mode, which is the unwanted response, only with the piezoelectric vibrating piece 410 eliminates the need for the filter or similar part to suppress the B-mode. Thus, simplifying the circuit ensures improving reliability and reducing the production cost. Furthermore, according to the piezoelectric vibrating piece 410, the configuration of the bar electrode 18 or similar part suppresses the flexure vibration, thereby ensuring suppressing both the increase of the R1 and the decrease of the Q factor to provide a piezoelectric vibrating piece of a good quality.

The bar electrode 18 or similar part is formed to the length including the region of the vibrator 12 when viewed from the Y"-axis direction in the X'''-axis direction, thereby ensuring effectively suppressing the flexure vibration. Since the bar electrode 18 or similar part is formed with the material and the thickness identical to the excitation electrode 414 or similar part, the bar electrode 18 or similar part is allowed to be formed simultaneously using the identical method to form the excitation electrodes 414 or similar part.

Next, an example of a fabricating method of the piezoelectric vibrating piece 410 will be described with reference to the drawings. The fabricating method for the piezoelectric vibrating piece 410 is approximately similar to the fabricating method for the piezoelectric vibrating piece 10 according to the above-described first embodiment. However, the fabricating method for the piezoelectric vibrating piece 410 is added with a process of forming the bar electrode 18 or similar part (bar electrode forming process) on the front surface 12a and the back surface 12b of the vibrator 12.

The fabricating method for the piezoelectric vibrating piece 410 prepares the vibrating piece body 11 through the process from Step S01 to Step S05 as illustrated in FIG. 2. Next, each of the front surface 12a and the back surface 12b of the vibrator 12 of the vibrating piece body 11 is formed with the excitation electrode 414 or similar part by the excitation electrode forming process (Step S06), then formed with the bar electrode 18 or similar part by the bar electrode forming process (Step S08). The excitation electrode forming process and the bar electrode forming process are simultaneously performed. As the excitation electrode forming process and the bar electrode forming process, for example, a photolithography method and etching, sputtering or a vacuum evaporation via a metal mask formed with an opening corresponding to the formation region of the excitation electrode 414 or similar part and the bar electrode 18 or similar part, a printing method such as screen-printing, or plating are employed. The process described above completes the piezoelectric vibrating piece 410. In the case where the excitation electrode 414 or similar part is configured such that the plurality of metal films are laminated and the material and the thickness of the bar electrode 18 or similar part are set to the material and thickness identical to a part of the metal films of the plurality of the metal films constituting the excitation electrode 414 or similar part, the bar electrode forming process may be performed simultaneously with the forming process of the part of the metal films described above constituting the excitation electrode 414 or similar part. The bar electrode forming process may be performed before the excitation electrode forming process, or may be performed after the excitation electrode forming process.

Thus, according to the fabricating method for the piezoelectric vibrating piece 410 described above, since the bar electrode forming process is simultaneously performed with the excitation electrode forming process, forming of the bar electrode 18 or similar part can be performed easily and the production cost of the piezoelectric vibrating piece 410 can be reduced. Fabricating methods in the working example 3 to the working example 16, which will be described later, are also similar to the fabricating method for the piezoelectric vibrating piece 410 described above.

Working Examples 3 to 16

Figure 6A:
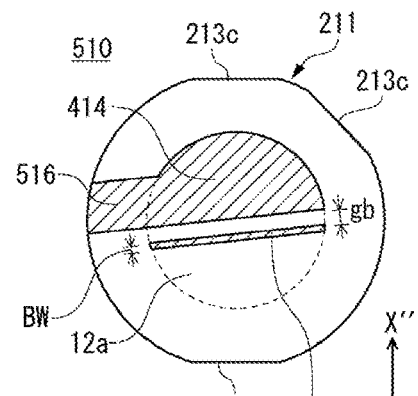
FIG. 6A to FIG. 6D illustrate working examples according to the second embodiment.
Figure 6B:
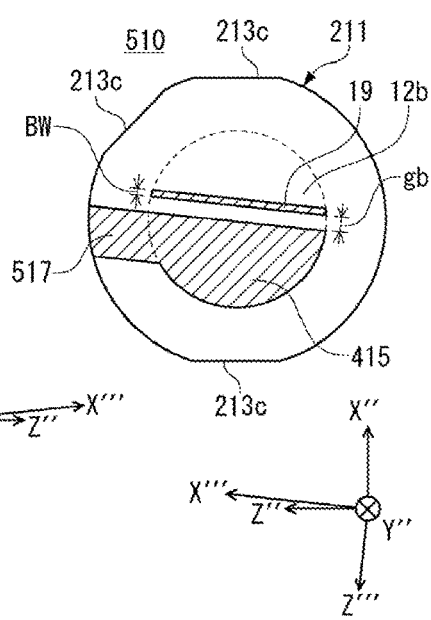
Figure 6C:
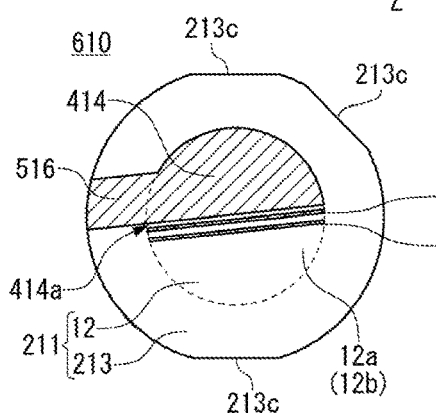
Figure 6D:
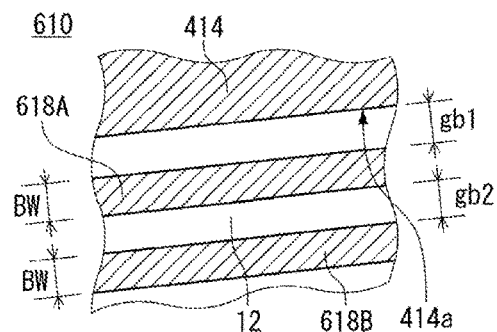

The following describes the working example 3 to the working example 16. Each of the working example 3 to the working example 16 is the working examples relating to the above-described second embodiment and including the bar electrode 18 or similar part. In the following description, a component that is identical or equal to that of the first embodiment is indicated by the same reference numeral, and the description thereof is omitted or simplified. FIG. 6A to FIG. 6D illustrate the working examples relating to the second embodiment. FIG. 6A is a plan view illustrating the working example 3, FIG. 6B is a back surface drawing of FIG. 6A, FIG. 6C is a plan view illustrating a working example 5, and FIG. 6D is a plan view of a relevant portion of the working example 5.

As illustrated in FIG. 6A and FIG. 6B, a piezoelectric vibrating piece 510 according to the working example 3 includes the vibrating piece body 211, the excitation electrodes 414 and 415, the bar electrodes 18 and 19, and extraction electrodes 516 and 517. The width BW of the bar electrodes 18 and 19 in the Z'''-axis direction are set to have a length that is 0.17 times of the wavelength λ (0.17λ) of the flexure vibration of the piezoelectric vibrating piece 510. The extraction electrodes 516 and 517 have a similar configuration to the extraction electrode 216 or similar part according to the working example 1 and the working example 2 in the first embodiment described above except that the inclined portion 14c or similar portion is not disposed.

A working example 4 has an identical configuration to the working example 3 described above, but the width BW is set to have a length that is 0.25 times of the wavelength λ (0.25λ) of the flexure vibration.

Figure 7A:
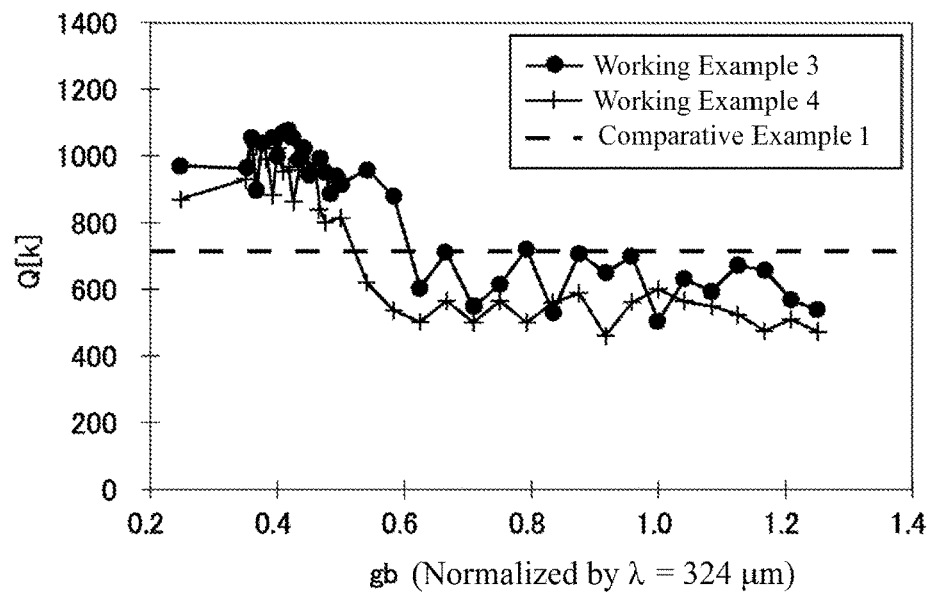
FIG. 7A and FIG. 7B are graphs illustrating a Q factor of a C-mode when an interval gb is varied in the working examples 3 and 4.
Figure 7B:
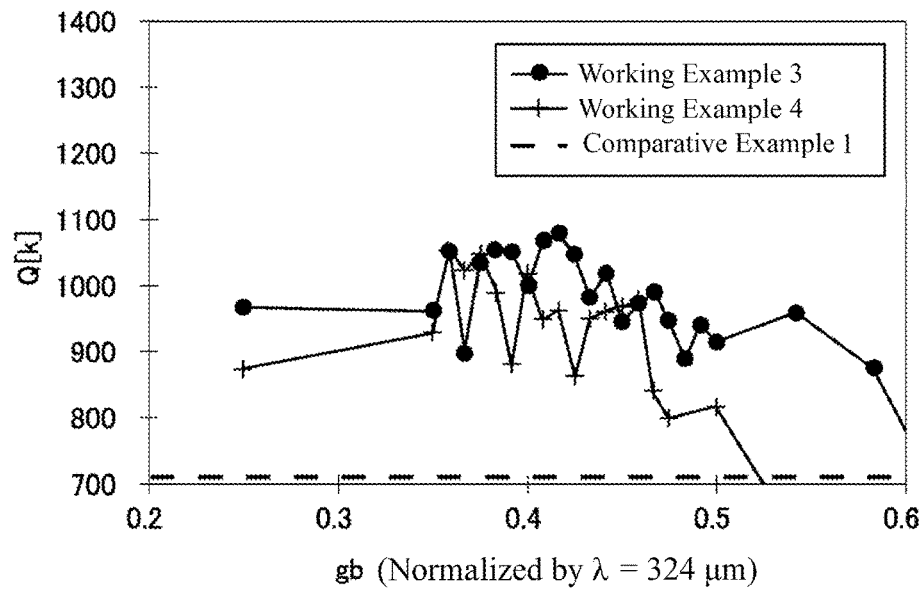

FIG. 7A and FIG. 7B are graphs showing the Q factors of the C-mode when the interval gb is varied in the working example 3 and the working example 4 configured as described above. The graphs in FIG. 7A and FIG. 7B are based on the numerical analysis (finite element method). Each of graphs illustrated in FIG. 8A to FIG. 10 described later is also based on the numerical analysis (finite element method). The comparative example 1 shown in FIG. 7A to FIG. 10 is configured similarly to the working example 3 to the working example 16, but is different from the working example 3 to the working example 16 in that the bar electrode 18 or similar part is not disposed. The graphs of the comparative example 1 shown in FIG. 7A to FIG. 10 are actually measured values.

In each of the graphs illustrated in FIG. 7A and FIG. 7B, a vertical axis indicates the Q factor of the C-mode. Each of scales on this vertical axis is designated with a numerical value equivalent to one-thousandth of the Q factor. The same applies to the numerical values attached to the vertical axes of the respective graphs illustrated in FIG. 8A to FIG. 10 described later.

In each of the graphs illustrated in FIG. 7A and FIG. 7B, a horizontal axis indicates a normalized interval gb. Numerical values on the horizontal axis are values that is calculated by dividing the intervals gb by the wavelength λ of the flexure vibration in the working example 3 and the working example 4 (324 μm). The same applies to the horizontal axes of the graphs illustrated in FIG. 8A to FIG. 10 described later. Although FIG. 7B illustrates a similar graph to FIG. 7A, FIG. 7B illustrates a part of a range of the horizontal axis of the graph in FIG. 7A.

As illustrated in FIG. 7A and FIG. 7B, both in the working example 3 and the working example 4, the Q factor of the C-mode is confirmed to become high (the CI becomes low) compared with the comparative example 1, which is without the bar electrode 18 or similar part, in a range where the interval gb is 0.25 to 0.50 times of the wavelength λ (0.25λ to 0.50λ) of the flexure vibration. Especially in the working example 3, the Q factor of the C-mode is approximately 1,000,000, which is relatively high. This confirms an excellent vibration characteristic. This result shows that setting each of the width BW of the bar electrodes 18 and 19 to 0.17λ to 0.25λ and the interval gb to 0.25λ to 0.50λ in the working example 3 and the working example 4 ensures suppressing the flexure vibration.

A piezoelectric vibrating piece 610 according to the working example 5 is a piezoelectric vibrating piece configured similarly to the working example 3 described above, as illustrated in FIG. 6C. However, each of the front surface 12a and the back surface 12b of the vibrator 12 of the vibrating piece body 211 is formed with two bar electrodes, a first bar electrode (bar electrode) 618A and a second bar electrode (bar electrode) 618B. The first bar electrode 618A and the second bar electrode 618B are disposed in parallel to one another. As illustrated in FIG. 6D, on the front surface 12a of the vibrator 12, the first bar electrode 618A is disposed with the first interval gb1 in the +Z'''-axis direction from the straight line portion 414a of the excitation electrode 414. On the front surface 12a of the vibrator 12, the second bar electrode 618B is disposed with the second interval gb2 in the +Z'''-axis direction from the first bar electrode 618A. Although an illustration is omitted, on the back surface 12b of the vibrator 12, a first bar electrode similar to the first bar electrode 618A and a second bar electrode similar to the second bar electrode 618B are disposed. The first bar electrode on the back surface 12b is formed with the first interval gb1 in the −Z'''-axis direction from the straight line portion 415a. The second bar electrode on the back surface 12b is formed with the second interval gb2 in the −Z'''-axis direction from the first bar electrode. The width BW of the first bar electrode 618A and the width BW of the second bar electrode 618B are set to be identical. The first interval gb1 and the second interval gb2 can arbitrarily be set within a range the first and the second bar electrodes can respectively be formed.

Here in the working example 5, the first interval gb1 is set to have a length that is 0.25 times of the wavelength λ (0.25λ) of the flexure vibration of the piezoelectric vibrating piece 610. The width BW of the first bar electrode 618A and the second bar electrode 618B are set to have a length that is 0.15 times of the wavelength λ (0.15λ) of the flexure vibration of the piezoelectric vibrating piece 610. Although the working example 6 to the working example 16 are configured similarly to the working example 5, one or both the first interval gb1 and the width BW are different from the working example 5. Table 2 shows the first interval gb1 and the width BW that are set in each of the working example 5 to the working example 16.

TABLE 2

|  | gb1 | BW |
| --- | --- | --- |
| Working Example 5 | 0.25λ | 0.15λ |
| Working Example 6 | 0.25λ | 0.20λ |
| Working Example 7 | 0.25λ | 0.25λ |
| Working Example 8 | 0.35λ | 0.15λ |
| Working Example 9 | 0.35λ | 0.20λ |
| Working Example 10 | 0.35λ | 0.25λ |
| Working Example 11 | 0.40λ | 0.15λ |
| Working Example 12 | 0.40λ | 0.20λ |
| Working Example 13 | 0.40λ | 0.25λ |
| Working Example 14 | 0.45λ | 0.15λ |
| Working Example 15 | 0.45λ | 0.20λ |
| Working Example 16 | 0.50λ | 0.15λ |

FIG. 8A to FIG. 10 are graphs illustrating the Q factors of the C-mode when the second interval gb2 is varied in the working example 5 to the working example 16.

Figure 8A:
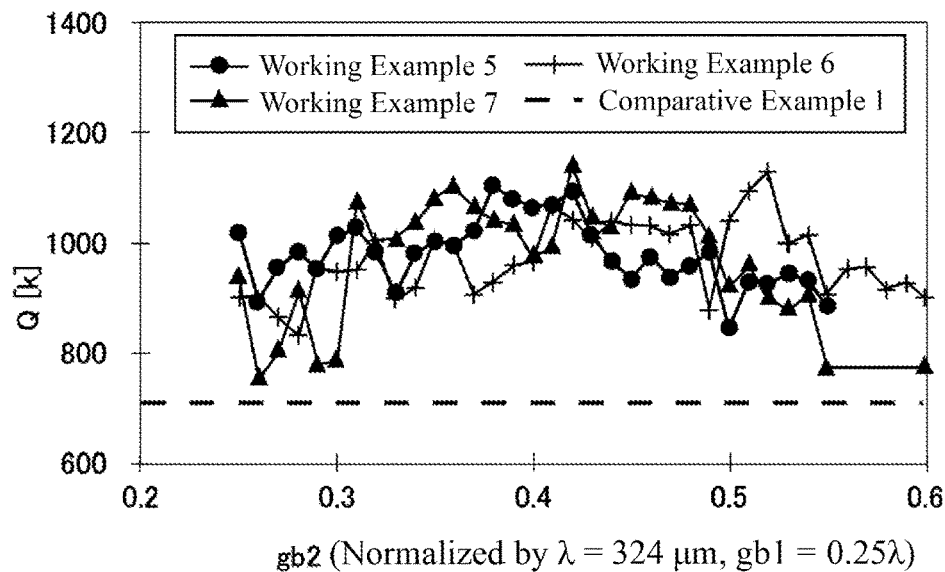
FIG. 8A and FIG. 8B are graphs illustrating the Q factor of the C-mode when an interval gb2 is varied in the working examples 5 to 10.
Figure 8B:
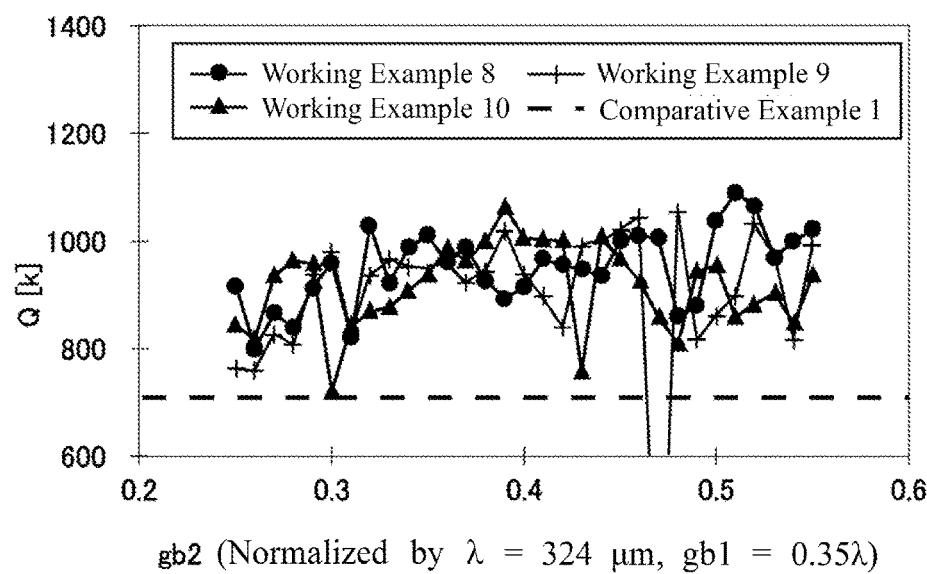
Figure 9A:
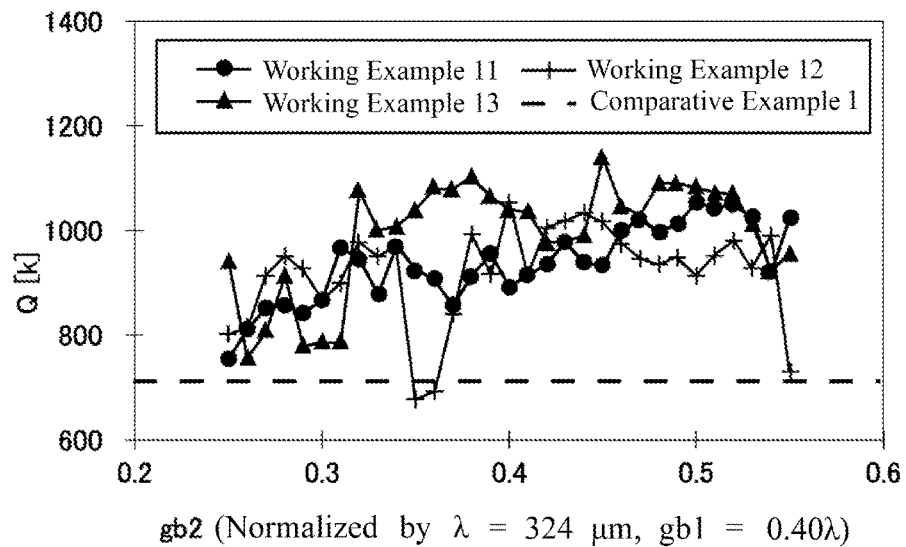
FIG. 9A and FIG. 9B are graphs illustrating the Q factor of the C-mode when the interval gb2 is varied in working examples 11 to 15.

FIG. 8A is a graph relating to the working example 5 to the working example 7 in which the first interval gb1 is set to have a length that is 0.25 times of the wavelength λ (0.25λ) of the flexure vibration. FIG. 8B is a graph relating to a working example 8 to the working example 10 in which the first interval gb1 is set to have a length that is 0.35 times of the wavelength λ (0.35λ) of the flexure vibration. FIG. 9A is a graph relating to the working example 11 to the working example 13 in which the first interval gb1 is set to have a length that is 0.40 times of the wavelength λ (0.40λ) of the flexure vibration.

As illustrated in FIG. 8A to FIG. 9A, as for the working examples 5 to 8, 10, 11, and 13, the Q factor of the C-mode is confirmed to become high (the CI becomes low) compared with the comparative example 1 in a range where the second interval gb2 has a length that is 0.25 to 0.55 times of the wavelength λ (0.25λ to 0.55λ) of the flexure vibration. Especially in the working example 5 to the working example 7 that are set to the above-described range, the Q factor of the C-mode is approximately 1,000,000, which is relatively high. This confirms an excellent vibration characteristic. As for a working example 9 and the working example 12, the Q factor is confirmed to become mostly high (the CI becomes low) compared with the comparative example 1 in a range where the second interval gb2 has a length that is 0.25 to 0.55 times of the wavelength λ (0.25λ to 0.55λ) of the flexure vibration. This result shows that setting the width BW of the bar electrode to 0.15λ to 0.25λ, the first interval gb1 to 0.25λ to 0.40λ, and the second interval gb2 to 0.25λ to 0.55λ in the piezoelectric vibrating piece 410 according to the second embodiment ensures suppressing the flexure vibration to reduce the energy loss of the C-mode.

Figure 9B:
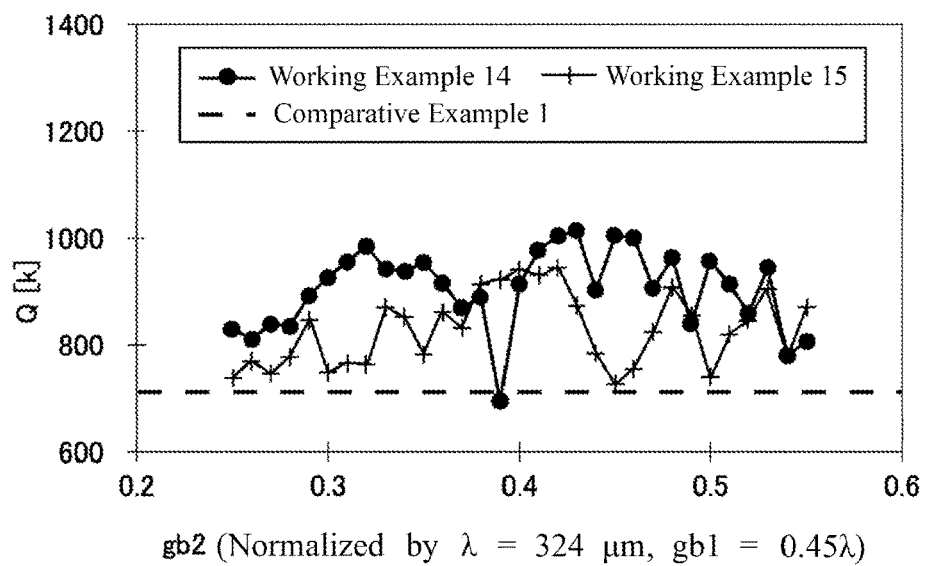

FIG. 9B is a graph relating to a working example 14 and the working example 15 in which the first interval gb1 is set to 0.45λ. As illustrated in FIG. 9B, as for the working example 14, the Q factor of the C-mode is confirmed to become high (the CI becomes low) compared with the comparative example 1 in a range where the second interval gb2 has a length that is 0.25 to 0.55 times of the wavelength λ (0.25λ to 0.55λ) of the flexure vibration. As for the working example 15, the Q factor of the C-mode is confirmed to mostly increase (the CI decreases) compared with the comparative example 1 in a range where the second interval gb2 is 0.25λ to 0.55λ. These results show that setting the width BW of the bar electrode to 0.15λ, to 0.20λ, the first interval gb1 to 0.45λ, and the second interval gb2 to 0.25λ to 0.55λ in the piezoelectric vibrating piece 410 according to the second embodiment ensures suppressing the flexure vibration to reduce the energy loss of the C-mode by.

Figure 10:
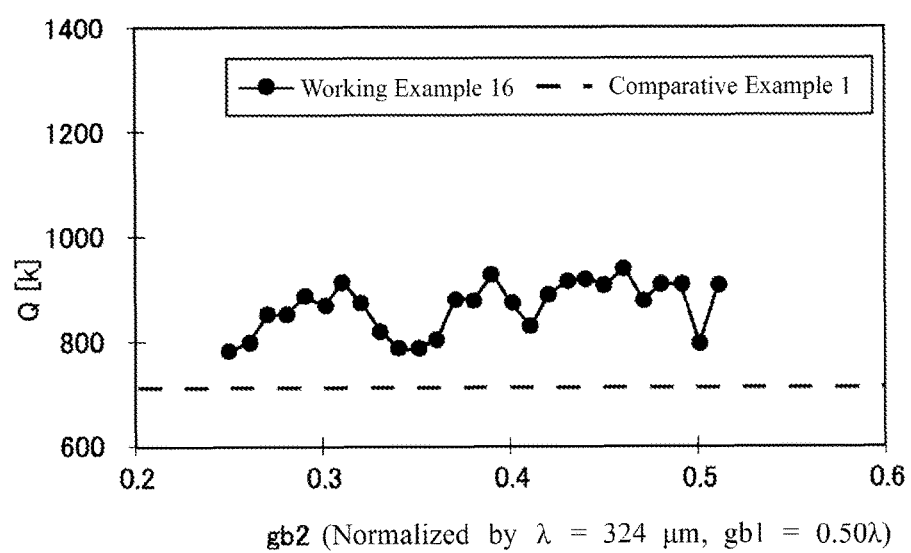
FIG. 10 is a graph illustrating the Q factor of the C-mode when the interval gb2 is varied in a working example 16.

FIG. 10 is a graph relating to the working example 16 in which the first interval gb1 is set to 0.50λ. As illustrated in FIG. 10, as for the working example 16, the Q factor of the C-mode is confirmed to become high (the CI becomes low) compared with the comparative example 1 in a range where the second interval gb2 is in a length that is 0.25 to 0.50 times of the wavelength λ (0.25λ to 0.50λ) of the flexure vibration. This result shows that setting the width BW of the bar electrode to 0.15λ the first interval gb1 to 0.50λ, and the second interval gb2 to 0.25λ to 0.50λ in the piezoelectric vibrating piece 410 according to the second embodiment ensures suppressing the flexure vibration to reduce the energy loss of the C-mode.

In the graphs in FIG. 8A to FIG. 10 illustrating the Q factors of the C-mode when the predetermined intervals gb1 and gb2 are varied, while the wavelength λ of the flexure vibration is used as the values relating to the predetermined intervals gb1 and gb2 for normalizing, the normalized value with reference to the wavelength of the C-mode instead of the wavelength λ may be used.

Third Embodiment

Figure 11:
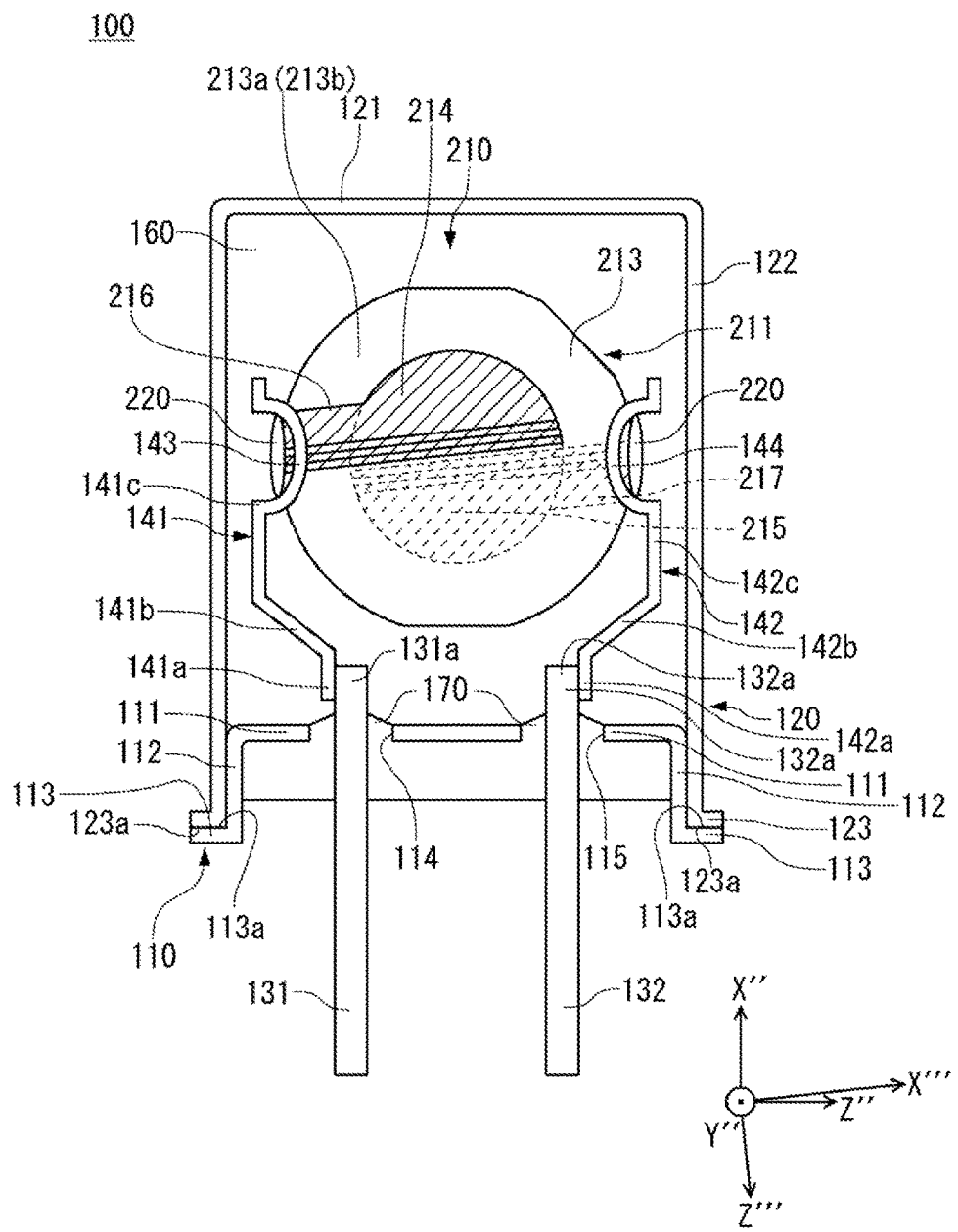
FIG. 11 is a plan view illustrating a piezoelectric device according to a third embodiment.

The following describes an exemplary piezoelectric device according to a third embodiment with reference to the drawings. As illustrated in FIG. 11, a piezoelectric device 100 includes the piezoelectric vibrating piece 210 according to the working example 1 described above, a base 110, a cover 120, leads 131 and 132, and the supporters 141 and 142. This piezoelectric device 100 is a piezoelectric resonator. The base 110 and the cover 120 are constituted of plate-shaped members made of metal such as copper (Cu), iron (Fe), nickel (Ni), alloy 42, and kovar. Instead of using metal, the base 110 and the cover 120 may be made of, for example, ceramic (such as aluminum compound), silicon, glass, and resin that are low in price and easy to form. The piezoelectric vibrating piece in the piezoelectric device 100 is not limited to be a configuration of the working example 1, but may be a configuration of the embodiment and other working examples described above other than the working example 1.

The piezoelectric vibrating piece 210 is supported with the supporters 141 and 142 in a housing space 160 formed of the base 110 and the cover 120. The +Z"-side and the −Z"-side of the piezoelectric vibrating piece 210 are supported with holders 143 and 144 of the supporters 141 and 142. The piezoelectric vibrating piece 210 is disposed in a state of standing with respect to the base 110 such that a planar surface formed with the excitation electrodes 214 and 215 is parallel to the X"Z"-surface. However, the arrangement is not limited as the drawing illustrates, and the piezoelectric vibrating piece 210 may be disposed being inclined with respect to the X"Z"-surface or being parallel to a Y"Z"-surface. The held portions of the piezoelectric vibrating piece 210 are not limited to the end portions on the +Z"-side and −Z"-side but may be other portions. The extraction electrodes 216 and 217 of the piezoelectric vibrating piece 210 are bonded on the holders 143 and 144 via the conductive adhesives 220 and 220. This ensures an electrical connection of the excitation electrodes 214 and 215 to the supporters 141 and 142, respectively.

The base 110 is formed in an ellipse shape viewing from the −X"-axis direction. The base 110 includes a planar portion (the +X"-side surface) 111, a tubular trunk portion 112 extending in the −X"-direction from the peripheral area of the planar portion 111, and a collar portion 113 projecting outward from the end portion of the trunk portion 112. The +X"-side surface of the collar portion 113 is formed with a bonding surface 113a bonded on a bonding surface 123a of the cover 120 described later. The base 110 may be in a shape such as a polygon other than a circle or a square when viewed from the X"-axis direction.

The planar portion 111 of the base 110 includes two through-holes 114 and 115 penetrating in a thickness direction (the X"-axis direction) of the base 110. The through-holes 114 and 115 are formed such that the leads 131 and 132 can respectively be inserted through. The through-holes 114 and 115 are filled with a sealing material 170 after the leads 131 and 132 are inserted through. This hermetically seals the through-holes 114 and 115. This hermetic seal secures the leads 131 and 132 to the base 110. For the sealing material 170, a non-conductive material such as a glass material or a resin material is used. Accordingly, even in the case where a conductive material such as metal is used in the base 110, an electrical connection of the base 110 to the leads 131 and 132 is prevented. The through-holes 114 and 115 may be hermetically sealed with a glass material or similar material and an inner side of the base 110 may be filled with resin or similar material.

The cover 120 includes a planar portion (the +X"-side surface) 121, a tubular trunk portion 122 extending in the −X"-direction from the peripheral area of the planar portion 121, and a collar portion 123 projecting outward from the end portion of the trunk portion 122. The trunk portion 122 is formed such that the trunk portion 112 of the base 110 can be inserted into. The −X"-side surface of the collar portion 123 is formed with the bonding surface 123a bonded on the bonding surface 113a of the base 110. The cover 120 is not limited to the configuration described above, but may employ any shapes that bonds to the base 110 to form the housing space 160.

The bonding surface 113a of the base 110 and the bonding surface 123a of the cover 120 are bonded by resistance welding such as seam welding and spot welding. The housing space 160 formed by bonding the base 110 and the cover 120 houses the piezoelectric vibrating piece 210. The housing space 160 is configured to be an inert atmosphere for the piezoelectric vibrating piece 210 such as a vacuum atmosphere and a nitrogen gas. The base 110 and the cover 120 may be bonded using various kinds of bonding material instead of weld bonding.

The leads 131 and 132 disposed in the through-holes 114 and 115 may employ a conductive metallic material such as copper, alloy of iron and nickel, kovar, and stainless steel. Distal end portions 131a and 132a of portions of the leads 131 and 132 extending from the planar portion 111 of the base 110 in the +X"-direction (inner leads) are attached with the supporters 141 and 142, respectively. Portions of the leads 131 and 132 extending from the base 110 in the −X"-direction (outer leads) are used as external terminals to electrically connect to a base plate or similar part. The supporter 141 includes a connecting portion 141a extending in the +X"-direction, a flexure portion 141b, a straight line portion 141c extending in the +X"-direction, and the holder 143 formed in a part of the straight line portion 141c. The supporter 142 similarly includes a connecting portion 142a, a flexure portion 142b, a straight line portion 142c, and the holder 144.

The piezoelectric vibrating piece 210 is secured and electrically connected to the holders 143 and 144 via the conductive adhesives 220 and 220, respectively. For the conductive adhesive 220, an adhesive such as epoxy-based, silicon-based, polyimide-based, or urethane-based is used.

Next, an exemplary fabricating method for the piezoelectric device 100 will be described. First, the base 110, which includes the leads 131 and 132 bonded with the supporters 141 and 142, the cover 120, and the piezoelectric vibrating piece 210 are each prepared. Subsequently, the piezoelectric vibrating piece 210 is inserted in between the supporters 141 and 142, and the end portions on the +Z"-side and the −Z"-side of the piezoelectric vibrating piece 210 are engaged in slits of the holders 143 and 144. Subsequently, applying the conductive adhesives 220 and 220 along the outer peripheral surface of the end portions of the piezoelectric vibrating piece 210 engaged in the slits secures the piezoelectric vibrating piece 210 to the holders 143 and 144 and electrically connect the extraction electrodes 216 and 217 to the supporters 141 and 142.

Next, under the vacuum atmosphere, the trunk portion 112 of the base 110 is engaged in the trunk portion 122 of the cover 120. Subsequently, the bonding surface 113a of the base 110 and the bonding surface 123a of the cover 120 are resistance welded. This bonds the base 110 and the cover 120 to form the housing space 160 and airtighly seal the housing space 160 in a vacuumed state. The process described above completes the piezoelectric device 100.

According to such piezoelectric device 100, the B-mode is suppressed only with a configuration of the piezoelectric vibrating piece 210 to eliminate the need for the filter or similar part to suppress the unwanted response and the flexure vibration is suppressed to suppress lowering of the excitation efficiency of the C-mode, thereby ensuring providing a piezoelectric device of a low-price and a good quality.

The piezoelectric device including the piezoelectric vibrating piece of the present disclosure and such piezoelectric vibrating piece has been described above. However, this disclosure is not limited to the above-described embodiment, and various changes of the embodiment may be made without departing from the spirit and scope of the disclosure. For example, the configurations of the above-described embodiments may be combined and both the inclined portion 14c or similar portion and the bar electrode may be formed in the piezoelectric vibrating piece 10 or similar part. The vibrating piece body 11 or similar part may employ a different cut from the SC-cut (such as an M-SC-cut and an IT-cut). The piezoelectric device 100 is not limited to a piezoelectric resonator housing only the piezoelectric vibrating piece but may be a piezoelectric oscillator packaged with an IC chip including an oscillator circuit or a piezoelectric filter connected with the piezoelectric vibrating piece of the present disclosure in a vertical row.

A width in the Z'''-axis direction in the inclined portion may be set to have a length that is 1.5 times or more of a wavelength of a flexure vibration that is different from a desired vibration of the piezoelectric vibrating piece. The inclined portion may be formed to gradually reduce a thickness in a staircase pattern toward the end portion of the excitation electrode. The pair of excitation electrodes may have g/t set to 0.183 to 0.366 in a case where an interval between the straight line portions facing to one another when viewed from the Y"-axis direction is g and a thickness of the vibrator is t.

In the present disclosure, a piezoelectric vibrating piece includes a vibrating piece body that includes a vibrator and at least one pair of excitation electrodes that are formed on a front surface and a back surface of the vibrator, respectively. The vibrating piece body is a doubly rotated quartz-crystal vibrating piece that is cut out in parallel to an X"Z"-surface that is rotated about a Z-axis of a crystallographic axis of a crystal and further rotated about an X'-axis. The pair of excitation electrodes are arranged in a Z'''-axis direction determined by an X'''-axis that is rotated by 260° to 300° counterclockwise about a Y"-axis using a +X"-axis direction as a reference and obliquely disposed with respect to the Y"-axis direction. The pair of excitation electrodes are formed to have respective semicircle shapes including straight line portions extending in the X'''-axis direction and disposed in a state where the straight line portions facing or overlapping with one another when viewed from the Y"-axis direction. The front surface and the back surface of the vibrator includes a bar electrode disposed separating from the straight line portion in a side of the straight line portion of the excitation electrode, having a predetermined width in the Z'''-axis direction, and extending in the X'''-axis direction.

The bar electrode may be formed to have a length that includes a region of the vibrator in the X'''-axis direction. The bar electrode may be formed with a material and a thickness identical to the excitation electrode. The bar electrode may be set to have a length that is 0.17 times to 0.25 times of the wavelength of the flexure vibration whose width in the Z'''-axis direction is different from a desired vibration of the piezoelectric vibrating piece and may be disposed one with an interval of a length that is 0.25 times to 0.50 times of the wavelength of the flexure vibration from the straight line portion. A plurality of the bar electrodes may be disposed on at least one side of the front surface and the back surface of the vibrator in parallel to one another. The plurality of the bar electrodes may have widths in the Z'''-axis direction set to be identical.

The plurality of the bar electrodes may include a first bar electrode arranged with a first interval from the straight line portion toward the Z'''-axis direction from the straight line portion and a second bar electrode arranged with a second interval from the first bar electrode. The first bar electrode and the second bar electrode may have widths in the Z'''-axis direction set to be identical. The widths of the first bar electrode and the second bar electrode may be set to have a length that is 0.15 times to 0.25 times of the wavelength of the flexure vibration different from a desired vibration of the piezoelectric vibrating piece, the first interval may be set to have a length that is 0.25 times to 0.40 times of the wavelength of the flexure vibration, and the second interval may be set to have a length that is 0.25 times to 0.55 times of the wavelength of the flexure vibration. The widths of the first bar electrode and the second bar electrode may be set to have a length that is 0.15 times to 0.20 times of the wavelength of the flexure vibration different from a desired vibration of the piezoelectric vibrating piece, the first interval may be set to have a length that is 0.45 times of the wavelength of the flexure vibration, and the second interval may be set to have a length that is 0.25 times to 0.55 times of the wavelength of the flexure vibration. The widths of the first bar electrode and the second bar electrode may be set to have a length that is 0.15 times of the wavelength of the flexure vibration different from a desired vibration of the piezoelectric vibrating piece, the first interval may be set to have a length that is 0.50 times of the wavelength of the flexure vibration, and the second interval may be set to have a length that is 0.25 times to 0.50 times of the wavelength of the flexure vibration. The pair of excitation electrodes may have g/t set to 0.183 to 0.366 in a case where an interval between the straight line portions facing to one another when viewed from the Y"-axis direction is g and a thickness of the vibrator is t.

In the present disclosure, a piezoelectric device includes the piezoelectric vibrating piece described above. In the present disclosure, a method for fabricating the piezoelectric vibrating piece including the above-described bar electrode includes an excitation electrode forming process that forms the excitation electrodes on the front surface and the back surface of the piezoelectric vibrating piece body and a bar electrode forming process that forms the bar electrodes on the front surface and the back surface of the piezoelectric vibrating piece body. The excitation electrode forming process and the bar electrode forming process are simultaneously performed.

According to the present disclosure, improving an excitation efficiency of a main vibration only with a piezoelectric vibrating piece and decreasing CI and suppressing an unwanted response compared with parallel electric field excitation. This eliminates a filter or similar part for suppressing the unwanted response. Thus, simplifying a circuit ensures improving reliability and reducing a production cost. Suppressing an unnecessary flexure vibration suppresses both an increase of an R1 and decrease of a Q factor of a C-mode, thereby ensuring providing a piezoelectric vibrating piece or similar part of a good quality with a reduced energy loss of the C-mode.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric vibrating piece, comprising:
a vibrating piece body that includes a vibrator; and
at least one pair of excitation electrodes that are formed on a front surface and a back surface of the vibrator, wherein
the vibrating piece body is a twice rotated quartz-crystal vibrating piece that is cut out in parallel to an X"Z"-surface, the X"Z"-surface being rotated about a Z-axis of a crystallographic axis of a crystal and further rotated about an X'-axis;
the pair of excitation electrodes are arranged in a Z'''-axis direction determined by an X'''-axis and obliquely disposed with respect to a Y"-axis direction, the X'''-axis being rotated by 260° to 300° counterclockwise about a Y"-axis using a +X"-axis direction as a reference,
the pair of excitation electrodes are formed to have respective semicircle shapes including straight line portions extending in an X'''-axis direction and to be disposed in a state where the straight line portions facing or overlapping with one another when viewed from the Y"-axis direction; and
the straight line portion of the excitation electrode includes an inclined portion that gradually decreases in thickness toward an end portion of the excitation electrode.

2. The piezoelectric vibrating piece according to claim 1, wherein
a width in the Z'''-axis direction in the inclined portion is set to have a length that is 1.5 times or more of a wavelength of a flexure vibration, the flexure vibration being different from a desired vibration of the piezoelectric vibrating piece.

3. The piezoelectric vibrating piece according to claim 1, wherein
the inclined portion gradually decreases in thickness in a staircase pattern toward the end portion of the excitation electrode.

4. The piezoelectric vibrating piece according to claim 1, wherein
the pair of excitation electrodes have g/t set to 0.183 to 0.366 in a case where an interval between the straight line portions facing to one another when viewed from the Y"-axis direction is g and a thickness of the vibrator is t.

5. A piezoelectric vibrating piece, comprising:
a vibrating piece body that includes a vibrator; and
at least one pair of excitation electrodes that are formed on a front surface and a back surface of the vibrator, wherein
the vibrating piece body is a twice rotated quartz-crystal vibrating piece that is cut out in parallel to an X"Z"-surface, the X"Z"-surface being rotated about a Z-axis of a crystallographic axis of a crystal and further rotated about an X'-axis;
the pair of excitation electrodes are arranged in a Z'''-axis direction determined by an X'''-axis and obliquely disposed with respect to a Y"-axis direction, the X'''-axis being rotated by 260° to 300° counterclockwise about a Y"-axis using a +X"-axis direction as a reference,
the pair of excitation electrodes are formed to have respective semicircle shapes including straight line portions extending in an X'''-axis direction and to be disposed in a state where the straight line portions facing or overlapping with one another when viewed from the Y"-axis direction; and
the front surface and the back surface of the vibrator include a bar electrode disposed separating from the straight line portion in a side of the straight line portion of the excitation electrode, the bar electrode having a predetermined width in the Z'''-axis direction, and the bar electrode extending in the X'''-axis direction.

6. The piezoelectric vibrating piece according to claim 5, wherein
the bar electrode is formed to have a length that includes a region of the vibrator the X'''-axis direction.

7. The piezoelectric vibrating piece according to claim 5, wherein
the bar electrode is formed with a material and a thickness identical to the excitation electrode.

8. The piezoelectric vibrating piece according to claim 5, wherein
the bar electrode is set to have a length that is 0.17 times to 0.25 times of a wavelength of a flexure vibration whose width in the Z'''-axis direction is different from a desired vibration of the piezoelectric vibrating piece and disposed one with an interval of a length that is 0.25 times to 0.50 times of the wavelength of the flexure vibration from the straight line portion.

9. The piezoelectric vibrating piece according to claim 5, wherein
a plurality of the bar electrodes are disposed on at least one side of the front surface and the back surface of the vibrator in parallel to one another.

10. The piezoelectric vibrating piece according to claim 9, wherein
the plurality of the bar electrodes have widths in the Z'''-axis direction set to be identical.

11. The piezoelectric vibrating piece according to claim 9, wherein
the plurality of the bar electrodes include a first bar electrode arranged with a first interval from the straight line portion toward the Z'''-axis direction from the straight line portion and a second bar electrode arranged with a second interval from the first bar electrode.

12. The piezoelectric vibrating piece according to claim 11, wherein
the first bar electrode and the second bar electrode have widths in the Z'''-axis direction set to be identical.

13. The piezoelectric vibrating piece according to claim 12, wherein
the widths of the first bar electrode and the second bar electrode are set to have a length that is 0.15 times to 0.25 times of a wavelength of a flexure vibration different from a desired vibration of the piezoelectric vibrating piece, the first interval is set to have a length that is 0.25 times to 0.40 times of the wavelength of the flexure vibration, and the second interval is set to have a length that is 0.25 times to 0.55 times of the wavelength of the flexure vibration.

14. The piezoelectric vibrating piece according to claim 12, wherein
the widths of the first bar electrode and the second bar electrode are set to have a length that is 0.15 times to 0.20 times of a wavelength of a flexure vibration different from a desired vibration of the piezoelectric vibrating piece, the first interval is set to have a length that is 0.45 times of the wavelength of the flexure vibration, and the second interval is set to have a length that is 0.25 times to 0.55 times of the wavelength of the flexure vibration.

15. The piezoelectric vibrating piece according to claim 12, wherein
the widths of the first bar electrode and the second bar electrode are set to have a length that is 0.15 times of a wavelength of a flexure vibration different from a desired vibration of the piezoelectric vibrating piece, the first interval is set to have a length that is 0.50 times of the wavelength of the flexure vibration, and the second interval is set to have a length that is 0.25 times to 0.50 times of the wavelength of the flexure vibration.

16. The piezoelectric vibrating piece according to claim 5, wherein
the pair of excitation electrodes have g/t set to 0.183 to 0.366 in a case where an interval between the straight line portions facing to one another when viewed from the Y"-axis direction is g and a thickness of the vibrator is t.

17. A piezoelectric device, comprising:
the piezoelectric vibrating piece according to claim 1.

18. A piezoelectric device, comprising:
the piezoelectric vibrating piece according to claim 5.

19. The piezoelectric vibrating piece according to claim 1, wherein
the vibrating piece body has a convex shape on one surface.

20. The piezoelectric vibrating piece according to claim 1, wherein
the vibrating piece body has convex shapes on both surfaces.

* * * * *